(12) United States Patent
Nakamura et al.

(10) Patent No.: US 6,201,748 B1
(45) Date of Patent: Mar. 13, 2001

(54) SEMICONDUCTOR MEMORY DEVICE HAVING TEST MODE

(75) Inventors: Yayoi Nakamura; Koji Tanaka; Yasuhiko Tsukikawa, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/556,658

(22) Filed: Apr. 24, 2000

(30) Foreign Application Priority Data

Oct. 29, 1999 (JP) .................................................. 11-308655

(51) Int. Cl.$^7$ ...................................................... G11C 7/00
(52) U.S. Cl. ...................................... 365/201; 365/189.11
(58) Field of Search ............................... 365/201, 189.05, 365/189.11, 189.08

(56) References Cited

U.S. PATENT DOCUMENTS

| | | | |
|---|---|---|---|
| 5,400,290 | 3/1995 | Suma et al. ........................ | 365/226 |
| 5,659,508 | * 8/1997 | Lamphier et al. .................. | 365/201 |
| 5,781,485 | * 7/1998 | Lee et al. ............................ | 365/201 |
| 5,905,690 | * 5/1999 | Sakurai et al. ..................... | 365/201 |
| 5,982,685 | * 11/1999 | Kim .................................... | 365/201 |

FOREIGN PATENT DOCUMENTS

| | | |
|---|---|---|
| 6-194424 | 7/1994 | (JP) . |
| 10-55696 | 2/1998 | (JP) . |

* cited by examiner

*Primary Examiner*—Tan T. Nguyen
(74) *Attorney, Agent, or Firm*—McDermott, Will & Emery

(57) ABSTRACT

In an output buffer of a DRAM, a level shifter outputs a step-up potential responsively when an internal data signal goes low or a test mode signature goes high. An N-channel MOS transistor is rendered conductive in response to the step-up potential from the level shifter, and sets a data input terminal to a power supply potential. The internal data signal and the test mode signature share the level shifter and the N-channel MOS transistor, and hence the layout area can be small and a high-level test mode signature can be output.

14 Claims, 17 Drawing Sheets

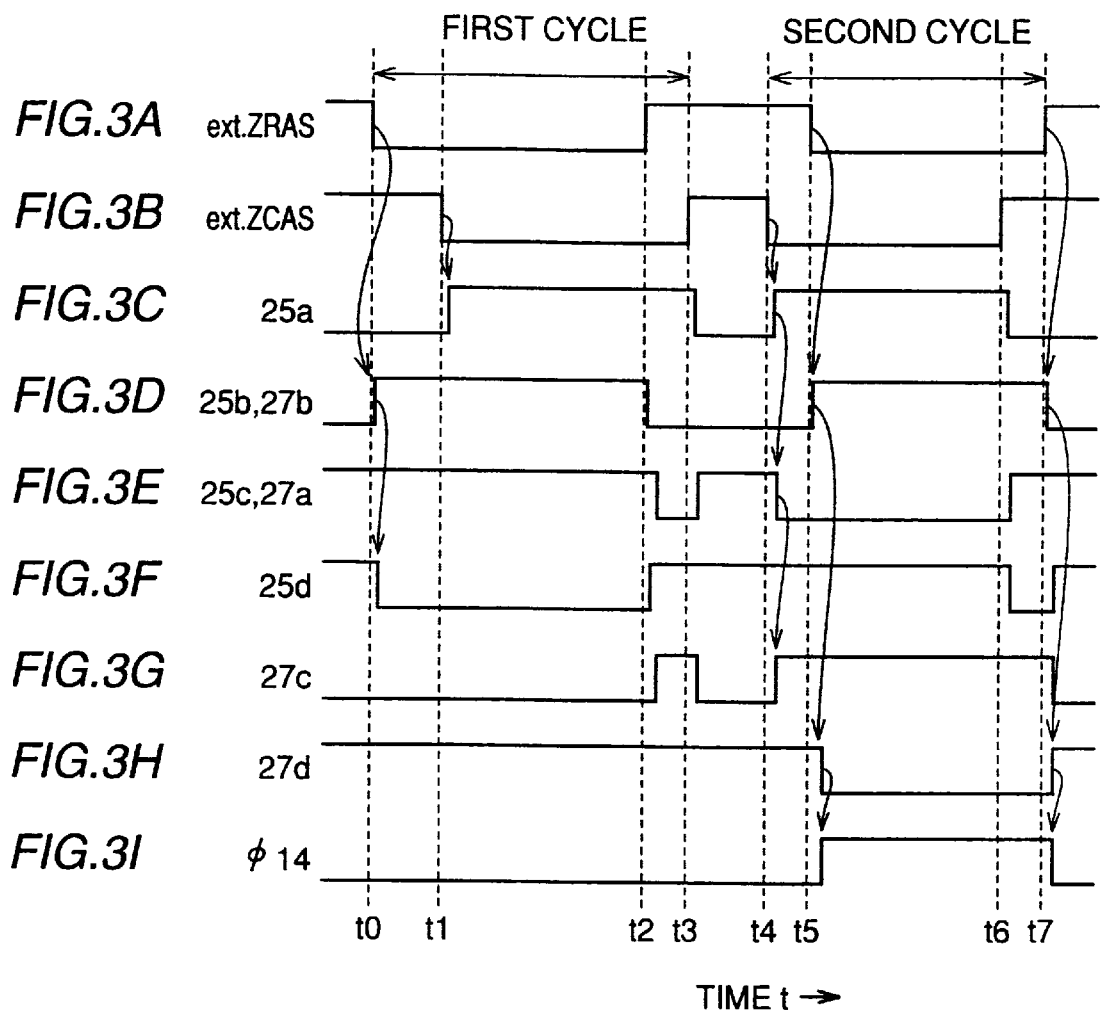
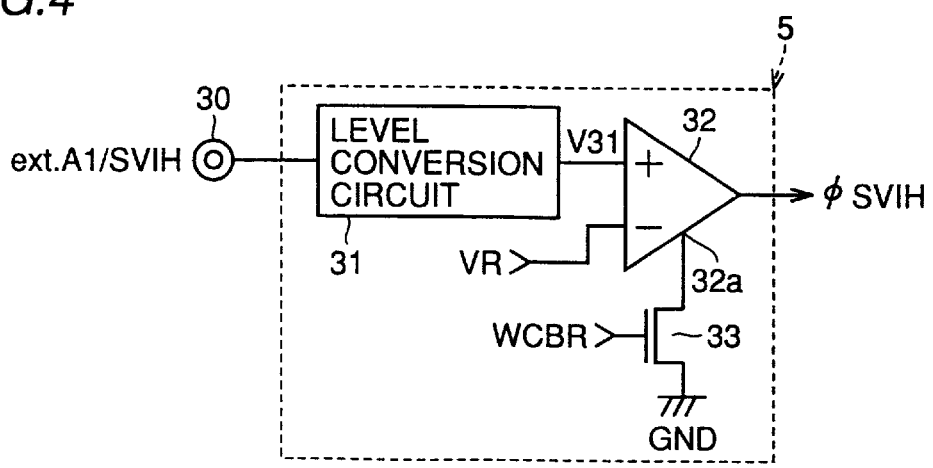

FIG. 11
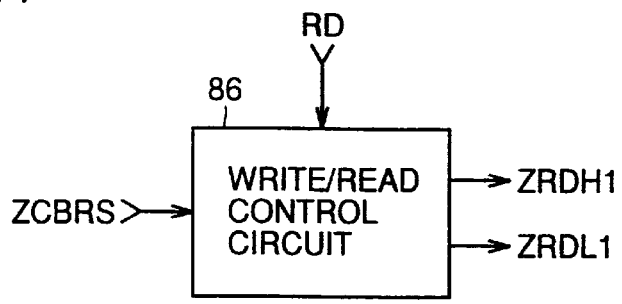
FIG. 12A  ext.ZRAS
FIG. 12B  ext.ZCAS
FIG. 12C  ext.ZWE
FIG. 12D  ext.ZOE
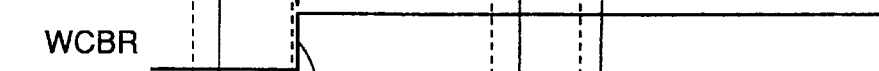
FIG. 12E  WCBR
FIG. 12F  ZRDH1
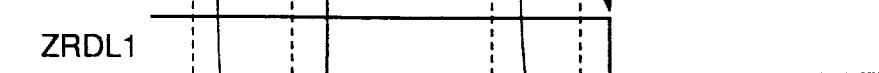
FIG. 12G  ZRDL1
FIG. 12H  ZCBRS
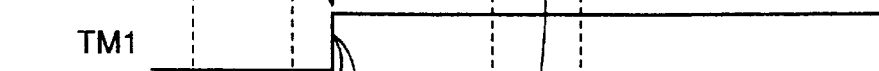
FIG. 12I  TM1
FIG. 12J  TMSIG1 (PRIOR ART)
FIG. 12K  TMSIG1 (INVENTION)
t0  t1     t2  t3
TIME t →

SEMICONDUCTOR MEMORY DEVICE HAVING TEST MODE

BACKGROUND OF THE INVENTION

1. Field of the Invention

The present invention relates to a semiconductor memory device, and more particularly, it relates to a semiconductor memory device outputting a test mode signature in a test mode.

2. Description of the Prior Art

FIG. 15 is a block diagram showing the structure of a conventional dynamic random access memory (hereinafter referred to as "DRAM"). Referring to FIG. 15, this DRAM comprises a clock generation circuit 101, a row and column address buffer 102, a row decoder 103, a column decoder 104, a memory mat 105, an input buffer 108 and an output buffer 109, and the memory mat 105 includes a memory array 106 and a sense amplifier+ input/output control circuit 107.

The clock generation circuit 101 selects a prescribed operation mode on the basis of externally supplied control signals ext.ZRAS, ext.ZCAS and ext.ZWE and controls the overall DRAM.

The row and column address buffer 102 generates row address signals RA0 to RAm and column address signals CA0 to CAm on the basis of externally supplied address signals ext.A0 to ext.Am (m:integer of at least 0) and supplies the generated row address signals RA0 to RAm and column address signals CA0 to CAm to the row decoder 103 and the column decoder 104 respectively.

The memory array 106 includes a plurality of memory cells each storing 1-bit data. The plurality of memory cells are previously divided into groups each including n (n: integer of at least 1) memory cells. Each memory cell group is arranged on a prescribed address decided by a row address and a column address.

The row decoder 103 specifies a row address of the memory array 106 in response to the row address signals RA0 to RAm supplied from the row and column address buffer 102. The column decoder 104 specifies a column address of the memory array 106 in response to the column address signals CA0 to CAm supplied from the row and column address buffer 102.

The sense amplifier+input/output control circuit 107 connects the n memory cells of the address specified by the row decoder 103 and the column decoder 104 to an end of a data bus DB. Another end of the data bus DB is connected to the input buffer 108 and the output buffer 109. The input buffer 108 supplies externally input data D1 to Dn to the selected n memory cells through the data bus DB in response to the control signal ext.ZWE in a write mode. The output buffer 109 outputs read data D1 to Dn from the selected n memory cells in response to an externally input control signal ZOE in a read mode.

In the read mode, the external address signals ext.A0 to ext.Am are supplied while the external control signal ext.ZRAS is set low for activation and thereafter the external control signal ext.ZCAS is set low for activation. Thus, the row decoder 103 and the column decoder 104 select n memory cells so that read data from the n memory cells are output through the sense amplifier+input/output control circuit 107 and the output buffer 109.

In the write mode, the external data D1 to Dn and the external address signals ext.A0 to ext.Am are supplied while the external control signal ext.ZRAS is set low for activation and thereafter the external control signals ext.ZCAS and ext.ZWE are set low for activation. Thus, the row decoder 103 and the column decoder 104 select n memory cells so that the data D1 to Dn are written in the selected n memory cells through the input buffer 108 and the sense amplifier+ input/output control circuit 107.

Such a DRAM stores a test circuit for testing whether or not the DRAM is normal before shipping, and various test modes can be set through input timing for the external control signals ext.ZRAS, ext.ZCAS and ext.ZWE and combination of the external address signals ext.A0 to ext.Am.

No problem arises if the DRAM is regularly set in a desired test mode in testing. If the DRAM is set in a test mode different from the desired one or not set in a test mode, however, no desired test is made but a defective unit may be shipped.

When setting a test mode of forcibly supplying an internal power supply voltage of the DRAM from outside, for example, the internal power supply voltage cannot be externally monitored and it is impossible to determine whether or not the internal power supply voltage is at the externally supplied level. Therefore, a desired test may not be performed but a defective unit may be shipped.

If the DRAM outputs a test mode signature responsive to the test mode only when set in the test mode, however, it is possible to determine whether or not the test mode is set by monitoring the test mode signature. Therefore, the DRAM stores a circuit for generating a test mode signature responsive to a test mode and outputting the same. A part of the DRAM related to test mode signatures is now described in detail.

FIG. 16 is a block diagram showing the structure of a part of the conventional DRAM related to test mode setting. Referring to FIG. 16, this DRAM includes input circuits 111 to 113, a WCBR determination circuit 114, a super VIH determination circuit 115 and an address determination circuit 116.

The input circuits 111 to 113 transmit the external control signals ext.ZRAS, ext.ZCAS and ext.ZWE and the external address signals ext.A1 to ext.A3 to the DRAM. The WCBR determination circuit 114 sets an internal control signal WCBR high for activation when the external control signals ext.ZCAS and ext.ZWE fall low in advance of the external control signal ext.ZRAS.

The super VIH determination circuit 115 is activated responsively when the signal WCBR goes high for activation, and sets a signal φSVIH high for activation responsively when a super VIH level SVIH sufficiently higher than a power supply voltage VCC is supplied to an input terminal for the external address signal ext.A1.

The address determination circuit 116 is activated responsively when the signal φSVIH goes high for activation for setting any of test signals TM1 to TM4 high for activation in response to the combination (00 to 11) of the levels of the external address signals ext.A2 and ext.A3, and reset by a reset signal RES.

As shown in FIG. 17, the address determination circuit 116 includes inverters 121 to 125, AND gates 126 and 127, clocked inverters 128 and 129 and NOR gates 130 and 131. The external address signal ext.A2 is input in first input nodes of the AND gates 126 and 127 through an input circuit 113a. The external address signal ext.A3 is input in a second input node of the AND gate 126 through an input circuit 113b and input in a second input node of the AND gate 127 through the input circuit 113b and the inverter 121.

Output signals φ126 and φ127 from the AND gates 126 and 127 are input in first input nodes of the NOR gates 130 and 131 through the clocked inverters 128 and 129 respectively. The signal φSVIH is input in the gates of N-channel MOS transistors of the clocked inverters 128 and 129, and input in the gates of P-channel MOS transistors of the clocked inverters 128 and 129 through the inverters 122 and 123. The reset signal RES is input in second input nodes of the NOR gates 130 and 131. The inverters 124 and 125 are connected between output nodes and the first input nodes of the NOR gates 130 and 131 respectively. The NOR gates 130 and 131 output the signals TM1 and TM2.

When the signals ext.A2 and ext.A3 are both high, i.e., when the combination is "11", the output signals φ126 and φ127 of the AND gates 126 and 127 go high and low respectively. When the signals ext.A2 and ext.A3 are high and low respectively, i.e., when the combination is "10", the output signals φ126 and φ127 of the AND gates 126 and 127 go low and high respectively. When the signal φSVIH goes high for activation, the clocked inverters 128 and 129 are activated so that the signals φ126 and φ127 are input in the first input nodes of the NOR gates 130 and 131 through the clocked inverters 128 and 129.

The signal φ126 is latched by a latch circuit formed by the NOR gate 130 and the inverter 124 to form the signal TM1. The signal φ127 is latched by a latch circuit formed by the NOR gate 131 and the inverter 125 to form the signal TM2. The clocked inverters 128 and 129 are inactivated when the signal φSVIH goes low, and the signals TM1 and TM2 are reset low when the reset signal RES goes high.

The signal TM3 goes high when the external address signals ext.A2 and ext.A3 go low and high respectively and the signal φSVIH goes high. The signal TM4 goes high when the external address signals ext.A2 and ext.A3 both go low and the signal φSVIH goes high. When any of the test signals TM1 to TM4 goes high, the DRAM is set in a test mode responsive to this signal.

FIG. 18 is a block diagram showing the structure of a part of this DRAM related to generation and output of test mode signatures. Referring to FIG. 18, the DRAM includes a test mode signature generation circuit 132 and an output buffer 133. It is assumed that the bit number n of data which can be simultaneously input/output is 4.

The test mode signature generation circuit 312 is activated responsively when the signal WCBR goes high for activation and outputs the test signals TM1 to TM4 as test mode signatures TMSIG1 to TMSIG4. As shown in FIG. 19, the test mode signature generation circuit 132 includes NAND gates 141 to 144 and inverters 145 and 148. The signal WCBR is input in first input nodes of the NAND gates 141 to 144. The signals TM1 to TM4 are input in second input nodes of the NAND gates 141 to 144 respectively. Output signals from the NAND gates 141 to 144 are inverted by the inverters 145 to 148 respectively, to form the test mode signatures TMSIG1 to TMSIG4.

When the signal WCBR is low for inactivation, all test mode signatures TMSIG1 to TMSIG4 are fixed low. When the signal WCBR is high for activation, the test signals TM1 to TM4 pass through the NAND gates 141 and 144 and the inverters 145 to 148 to form the test mode signatures TMSIG1 to TMSIG4.

The output buffer 133 outputs data signals D1 to D4 in accordance with internal data signals ZRDH1 to ZRDH4 and ZRDL1 to ZRDL4 in a general read mode, and outputs test mode signatures TMSIG1' to TMSIG4' in accordance with the test mode signatures TMSIG1 to TISIG4 in the test mode.

As shown in FIG. 20, the output buffer 133 includes an output buffer 133a provided in correspondence to the signals ZRDH1, ZRDL1 and TMSIG1. In addition to the buffer 133a, the output buffer 133 includes three buffers provided in correspondence to the signals ZRDH2, ZRDL2 and TMSIG2, ..., ZRDH4, ZRDL4 and TMSIG4 respectively. The four buffers are identical in structure to each other, and hence only the buffer 133a is described.

The buffer 133a includes inverters 151 to 156, a level shifter 157 and N-channel MOS transistors 158 to 160. The N-channel MOS transistors 158 and 159 are connected in parallel between a line of the power supply potential VCC and a data input/output terminal 150 for the data signal D1. The N-channel MOS transistor 160 is connected between the data input/output terminal 150 and a line of a ground potential GND. The signal ZRDH1 is input in the gate of the N-channel MOS transistor 158 through the inverters 151 to 153 and the level shifter 157. The test mode signature TMSIG1 is input in the gate of the N-channel MOS transistor 159. The signal ZRDL1 is input in the gate of the N-channel MOS transistor 160 through the inverters 154 to 156. An output signal φ157 of the level shifter 157 goes low when an input signal φ133 is low, and reaches a step-up potential VPP when the input signal φ133 is high.

When the signal ZRDH1 goes low for activation, the level shifter 157, i.e., the output signal φ157 reaches the step-up potential VPP, the N-channel MOS transistor 158 is rendered conductive, and the data signal D1 goes high. When the test mode signature TMSIG1 goes high for activation, the N-channel MOS transistor 159 is rendered conductive and the test mode signature TMSIG1' goes high. When the signal ZRDL1 goes low for activation, the N-channel MOS transistor 160 is rendered conductive and the data signal D1 goes low.

FIG. 21 is a timing chart showing operations of the part of the DRAM shown in FIGS. 16 to 20 related to the test mode signatures. For simplifying the illustration, the following description is made with reference to only operations of a part related to the test mode signature TMSIG1.

The signals ext.ZRAS, ext.ZCAS and ext.ZWE fall low at timing of WCBR, the signal WCBR goes high for activation, and the super VIH determination circuit 115 and the test signature generation circuit 132 are activated. The super VIH level SVIH is supplied to the input terminal for the external address signal ext.A1, the signal φSVIH goes high for activation, and the address determination circuit 116 is activated. The external address signals ext.A2 and ext.A3 are both set high, the signal TM1 goes high and the test mode signatures TMSIG1 and TMSIG1' also go high. It is possible to detect that the DRAM is set in a test mode responsive to the signal TM1 by detecting that the test mode signature TMSIG1' is high.

However, the conventional DRAM is provided with the dedicated N-channel MOS transistor 159 for outputting the test mode signatures TMSIG1' to TMSIG4' while the size of this N-channel MOS transistor 159 is increased for improving resistance against a surge voltage supplied to the data input/output terminal 150, and hence the layout area of the output buffer 133 is disadvantageously increased.

The level shifter 157 for the test mode signature TMSIG1 is omitted in order to reduce the layout area of the output buffer 133, and hence the high level of the test mode signature TMSIG1' is VCC−Vth, where Vth represents the threshold voltage of the N-channel MOS transistor 159, lower than the power supply potential VCC.

In addition, the conventional DRAM regularly outputs the test mode signatures TMSIG1' to TMSIG4' when set in the test mode, and hence the test mode signatures TMSIG1' to TMSIG4' may collide with read data.

SUMMARY OF THE INVENTION

Accordingly, a principal object of the present invention is to provide a semiconductor memory device comprising an output buffer having a small layout area.

Another object of the present invention is to provide a semiconductor memory device capable of preventing collision of a test mode signature and read data.

In a semiconductor memory device according to an aspect of the present invention, an output buffer includes a logic circuit activating a third internal data signal in response to activation of at least either a first internal data signal or a test mode signature, a first transistor connected between a line of a first power supply voltage and a data output terminal and rendered conductive in response to activation of the third internal data signal, and a second transistor connected between the data output terminal and a line of a second power supply potential and rendered conductive in response to activation of a second internal data signal. Thus, the first internal data signal and the test mode signature share the first transistor, and hence the layout area can be reduced as compared with the prior art separately provided with the transistors for the first internal data signal and the test mode signature.

Preferably, the output buffer further includes a step-up potential generation circuit supplying a step-up potential stepped up from the first power supply potential to an input electrode of the first transistor for rendering the first transistor conductive in response to activation of the third internal data signal. In this case, the step-up potential generation circuit outputs the step-up potential in response to activation of at least either the first internal data signal or the test mode signature, and hence a test mode signature of a higher level can be output as compared with the prior art provided with only the step-up potential generation circuit for the first internal data signal.

Preferably, the output buffer further includes a control circuit fixing the second transistor to a non-conductive state in response to activation of the test mode signature also when the second internal data signal is active. Therefore, the test mode signature is prevented from colliding with read data and feeding a through current to the output buffer.

Preferably, a memory array, a read circuit, a first signal generation circuit and the output buffer are provided in N sets (N: integer of at least 2), and a second signal generation circuit includes first to N-th address determination circuits activating first to N-th test signals for setting first to N-th test modes responsively when a plurality of predetermined external address signals are set to combination of predetermined first to N-th logical levels respectively and a test mode signature generation circuit supplying the first to N-th test signals to the N output buffers as first to N-th test mode signatures respectively. In this case, N types of test mode signatures can be output to N data output terminals respectively.

Preferably, the memory array, the read circuit, the first signal generation circuit and the output buffer are provided in N sets (N: integer of at least 2), and the second signal generation circuit includes first to M-th (M:integer greater than N) address determination circuits activating first to M-th test signals for setting first to M-th test modes responsively when a plurality of predetermined external address signals are set to combination of predetermined first to M-th logical levels respectively and a test mode signature generation circuit generating N-bit test mode signatures indicating the number of activated test signal among the first to M-th test signals and supplying the N-bit test mode signatures to the N output buffers respectively. In this case, the N-bit test mode signatures indicating a set test mode among M types of test modes can be output to the N data output terminals respectively.

In a semiconductor memory device according to another aspect of the present invention, a second signal generation circuit is activated in response to activation of a first external control signal after activation of second and third external control signals for activating a test mode signature indicating that a test mode is set responsively when a plurality of predetermined external address signals among a plurality of external address signals are set to combination of predetermined logical levels and inactivating the test mode signature in response to inactivation of the second external control signal. Also when the second external control signal is activated again and a second internal data signal is activated, therefore, the test mode signature will not collide with the second internal data signal.

Preferably, the second signal generation circuit includes an address determination circuit activating a test signal responsively when the plurality of predetermined external address signals are set to the combination of the predetermined logical levels and a test mode signature generation circuit supplying the test signal output from the address determination circuit to an output buffer as the test mode signature and inactivating the test mode signature in response to inactivation of the second external control signal when the first external control signal is active. In this case, the second signal generation circuit can be readily formed.

Preferably, a memory array, a read circuit, a first signal generation circuit and the output buffer are provided in N sets (N: integer of at least 2), and the second signal generation circuit includes first to N-th address determination circuits activating first to N-th test signals responsively when a plurality of predetermined external address signals are set to combination of predetermined first to N-th logical levels respectively and a test mode signature generation circuit supplying the first to N-th test signals to the N output buffers as first to N-th test mode signatures and inactivating each of the first to N-th test mode signatures in response to inactivation of the second external control signal when the first external control signal is active. In this case, N types of test mode signatures can be output to N data output terminals respectively.

Preferably, the memory array, the read circuit, the first signal generation circuit and the output buffer are provided in N sets (N: integer of at least 2), and the second signal generation circuit includes first to M-th (M:integer greater than N) address determination circuits activating first to M-th test signals responsively when a plurality of predetermined external address signals are set to combination of predetermined first to M-th logical levels respectively and a test mode signature generation circuit generating N-bit test mode signatures indicating the number of activated test signal for supplying the N-bit test mode signatures to the N output buffers and inactivating each of the N-bit test mode signatures in response to inactivation of the second external control signal when the first external control signal is active. In this case, the N-bit test mode signatures indicating a set test mode among M types of test modes can be output to N data output terminals respectively.

In a semiconductor memory device according to still another aspect of the present invention, a second signal generation circuit includes an address determination circuit activated in a test mode set period activating a first internal control signal for activating a test signal responsively when a plurality of predetermined external address signals are set to combination of predetermined logical levels and a test mode signature generation circuit activated in a test mode signature output period activating a second internal control signal for supplying the test signal output to an output buffer as a test mode signature. Thus, the test mode set period for setting a test mode is separated from the output period outputting the test mode signature so that the test mode signature is not output so far as the second internal control signal is inactive, and hence the test mode signature can be prevented from colliding with read data.

Preferably, the second signal generation circuit further includes an internal control signal generation circuit activated in response to activation of a first external control signal after activation of second and third external control signals for activating the first internal control signal responsively when a predetermined external address signal is set to a first logical level and activating the second internal control signal responsively when the predetermined external address signal is set to a second logical level. In this case, the first and second internal control signals can be readily generated.

Preferably, the internal control signal generation circuit inactivates the second internal control signal in response to inactivation of the second external control signal when the first external control signal is active also when the predetermined external address signal is set to the second logical level. In this case, the test mode signature will not collide with a second internal data signal also when the second external control signal is activated again and the second internal data signal is activated.

Preferably, a memory array, a read circuit, a first signal generation circuit and the output buffer are provided in N sets (N: integer of at least 2), and the second signal generation circuit includes first to N-th address determination circuits activated in the test set mode for activating first to N-th test signals responsively when a plurality of predetermined external address signals are set to combination of predetermined first to N-th logical levels respectively and a test mode signature generation circuit supplying the first to N-th test signals to the N output buffers as first to N-th test mode signatures respectively. In this case, N types of test mode signatures can be output to N data output terminals respectively.

Preferably, the memory array, the read circuit, the first signal generation circuit and the output buffer are provided in N sets (N: integer of at least 2), and the second signal generation circuit includes first to M-th (M:integer greater than N) address determination circuits activated in the test mode set period for activating first to M-th test signals responsively when a plurality of predetermined external address signals are set to combination of predetermined first to M-th logical levels respectively and a test mode signature generation circuit activated in the test mode signature output period for generating N-bit test mode signatures indicating the number of activated test signal and supplying the N-bit test mode signatures to the N output buffers respectively. In this case, the N-bit test mode signatures indicating a set test mode among M types of test modes can be output to N data output terminals respectively.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3A to 3I are timing charts showing operations of the WCBR determination circuit shown in FIG. 2;

FIG. 4 is a circuit block diagram showing the structure of a super VIH determination circuit shown in FIG. 1;

FIG. 11 is a block diagram for illustrating effects of the DRAM shown in FIGS. 1 to 10P;

FIGS. 12A to 12K are timing charts for illustrating the effects of the DRAM illustrated in FIGS. 1 to 10P;

DESCRIPTION OF THE PREFERRED EMBODIMENTS

Figure 1:
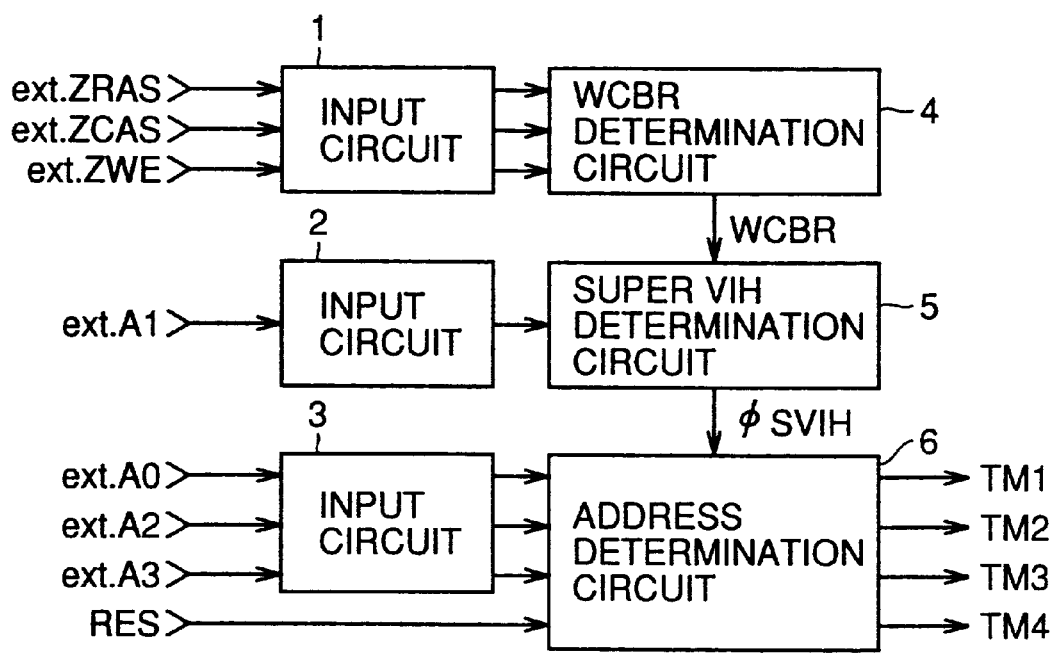
FIG. 1 is a block diagram showing the structure of a part, related to setting of test modes, of a DRAM according to an embodiment of the present invention.

FIG. 1 is a block diagram showing the structure of a part, related to setting of test modes, of a DRAM according to an embodiment of the present invention. Referring to FIG. 1, this DRAM comprises input circuits 1 to 3, a WCBR determination circuit 4, a super VIH determination circuit 5 and an address determination circuit 6.

The input circuits 1 to 3 transmit external control signals ext.ZRAS, ext.ZCAS and ext.ZWE and external address signals ext.A0 to ext.A3 into the DRAM. The WCBR determination circuit 4 sets an internal control signal WCBR high for activation when the external control signal ext.ZRAS falls in a delay from the external control signals ext.ZCAS and ext.ZWE, i.e., at timing of WCBR.

Figure 2:
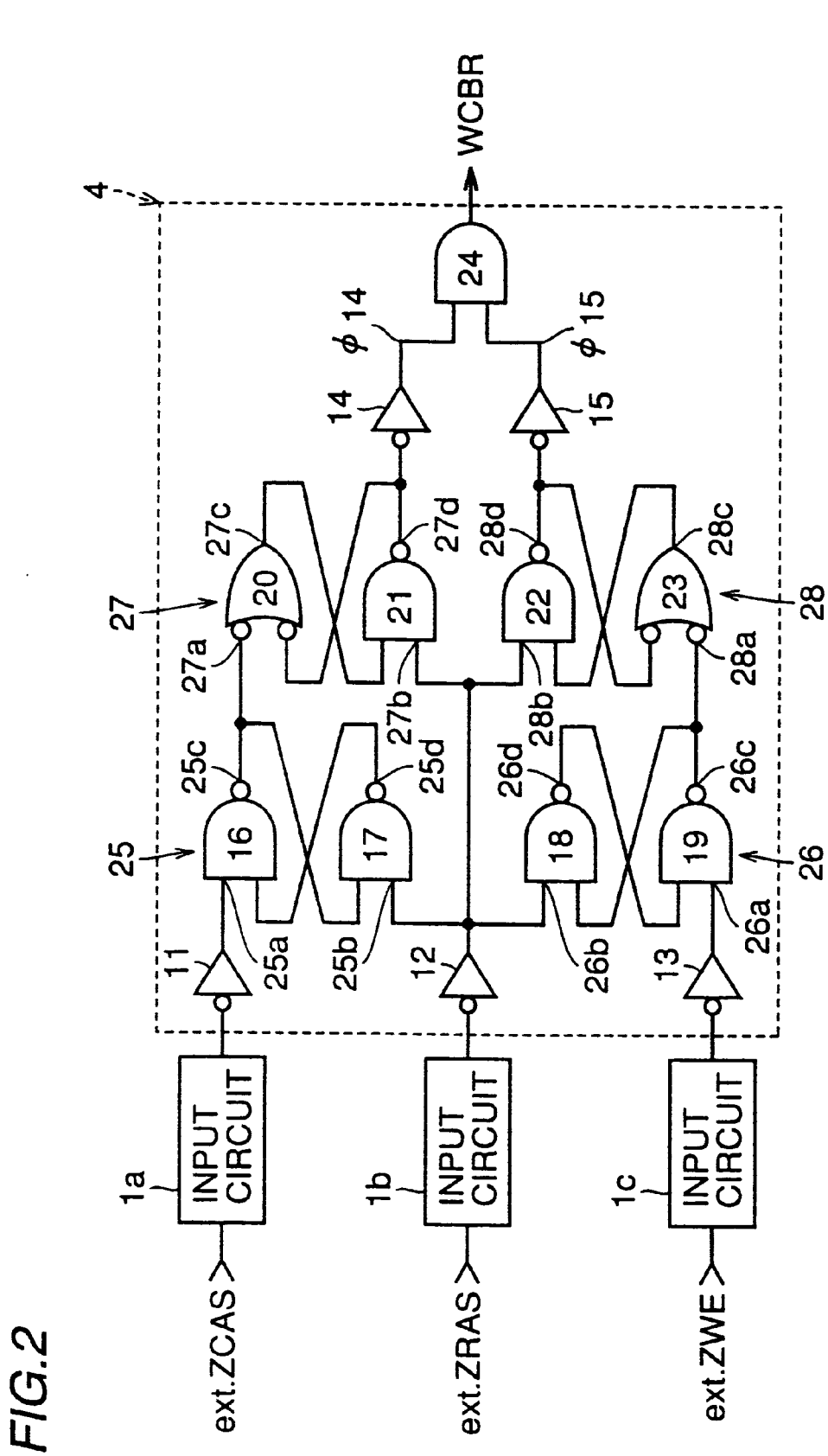
FIG. 2 is a circuit diagram showing the structure of a WCBR determination circuit shown in FIG. 1.

As shown in FIG. 2, the WCBR determination circuit 4 includes inverters 11 to 15, NAND gates 16 to 23 and an AND gate 24, and the NAND gates 16 and 17, 18 and 19, 20 and 21 and 22 and 23 form flip-flops 25 to 28 respectively. The external control signal ext.ZCAS is input in a set terminal 25a of the flip-flop 25 through an input circuit 1a and the inverter 11. The external control signal ext.ZRAS is input in reset terminals 25b to 28b of the flip-flops 25 to 28 through an input circuit 1b and the inverter 12. The external control signal ext.ZWE is input in a set terminal 26a of the flip-flop 26 through an input circuit 1c and the inverter 13. Output terminals 25c and 26c of the flip-flops 25 and 26 are connected to set terminals 27a and 28a of the flip-flops 27 and 28 respectively. The inverters 14 and 15 are connected between inversion output terminals 27d and 28d of the flip-flops 27 and 28 and first and second input nodes of the AND gate 24 respectively. The AND gate 24 outputs the signal WCBR.

A circuit formed by the inverters 11, 12 and 14 and the flip-flops 25 and 27 is identical in structure to a circuit formed by the inverters 13, 12 and 15 and the flip-flops 26 and 28, and hence circuit operations of the former are described. Referring to FIGS. 3A to 3I, the first cycle shows the timing of a general operation, and the second cycle shows the timing of WCBR. In an initial state, the external control signals ext.ZRAS and ext.ZCAS are both set high, the terminals 25a, 25b, 27b and 27c and a signal φ14 go low, and the terminals 25c, 27a, 25d and 27d are high.

When the external control signal ext.ZRAS first falls low at a time t0, the terminals 25b and 27b go high to set the flip-flop 27 and the terminal 25d goes low. However, the terminal 25a is low and hence the level of the terminal 25c remains unchanged and the signal φ14 also remains low. Then, when the external control signal ext.ZCAS falls low at a time t1, the terminal 25a goes high while the terminal 25d is low and hence the level of the terminal 25c remains unchanged and the signal φ14 also remains low. At the general timing when the external control signal ext.ZRAS falls in advance of the external control signal ext.ZCAS, therefore, the signal φ14 remains low and the signal WCBR also remains low.

When the external control signal ext.ZCAS first falls low at a time t4 after returning to the initial state, the terminal 25a goes high to reset the flip-flop 25, whereby the terminals 25c and 27a go low to reset the flip-flop 27 and the terminal 27c goes high. When the external control signal ext.ZRAS falls low at a time t5, the terminals 25b and 27b go high to set the flip-flop 27, whereby the terminal 27d goes low and the signal φ14 goes high. When the external control signal ext.ZRAS falls after the external control signal ext.ZCAS, therefore, the signal φ14 rises high.

In the circuit formed by the inverters 12, 13 and 15 and the flip-flops 26 and 28, a signal φ15 remains low and the signal WCBR also remains low at the general timing when the external control signal ext.ZRAS falls in advance of the external control signal ext.ZWE. At the timing when the external control signal ext.ZRAS falls after the external control signal ext.ZWE, the signal φ15 goes high.

At the timing of WCBR when the external control signal ext.ZRAS falls after the external control signals ext.ZCAS and ext.ZWE, therefore, the signals φ14 and φ15 both go high and the signal WCBR also goes high. When the signal ext.ZRAS goes high, the terminals 25b to 28b go low and the terminals 25d to 28d go high, while the signals φ14 and φ15 go low and the signal WCBR also goes low.

As shown in FIG. 4, the super VIH determination circuit 5 includes a level conversion circuit 31, a comparator 32 and an N-channel MOS transistor 33. The level conversion circuit 31 steps down a potential supplied to an input terminal 30 for the external address signal ext.A1 by a prescribed voltage and supplies the stepped-down potential to a non-inversion input terminal of the comparator 32. An output potential V31 from the level conversion circuit 31 is lower than a reference potential VR when the external address signal ext.A1, i.e., a high level (power supply potential VCC) or a low level (ground potential GND) is supplied to the input terminal 30, and higher than the reference potential VR when the VIH level SVIH sufficiently higher than the power supply potential VCC is supplied to the input terminal 30. The reference potential VR is supplied to an inversion input terminal of the comparator 32. The N-channel MOS transistor 33 is connected between a control terminal 32a of the comparator 32 and a line of the ground potential GND, and its gate receives the signal WCBR. An output signal from the comparator 32 forms an output signal φSVIH of the super VIH determination circuit 5.

When the signal WCBR goes high for activation, the N-channel MOS transistor 33 is rendered conductive and the control terminal 32a is grounded to activate the comparator 32. When the super VIH level SVIH is supplied to the input terminal 30 for the external address signal ext.A1, the output potential V31 of the level conversion circuit 31 exceeds the reference potential VR and the signal φSVIH goes high for activation. When the signal WCBR is low for activation and the input terminal 30 is supplied with the external address signal ext.A1, the signal φSVIH goes low for inactivation.

The address determination circuit 6 is activated when the external address signal ext.A0 is low and the signal φSVIH is high for setting any of test signals TM1 to TM4 high for activation in response to the combination (11, 10, 01 or 00) of the logical levels of the external address signals ext.A2 and ext.A3, and reset by a reset signal RES.

Figure 5:
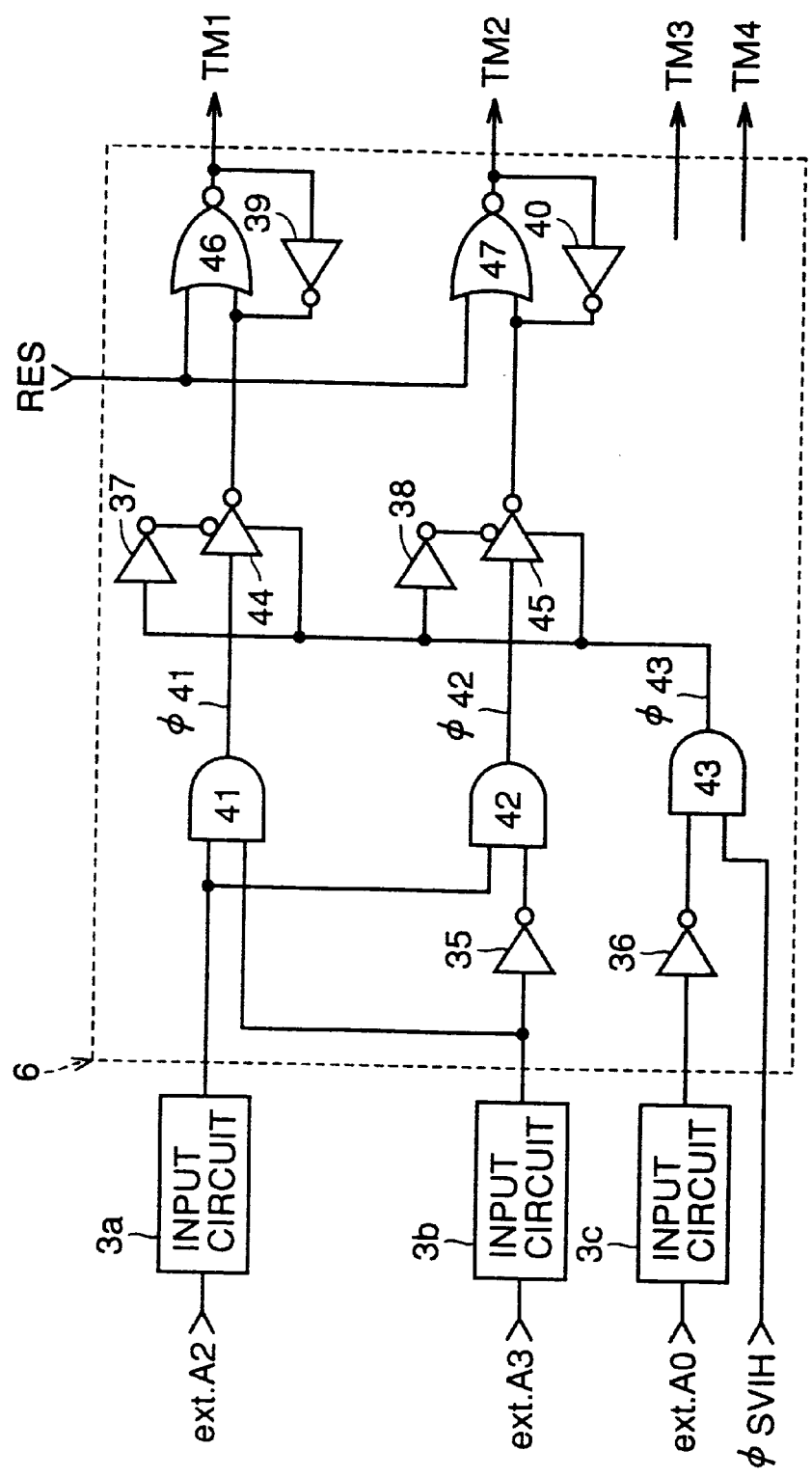
FIG. 5 is a circuit diagram showing the structure of an address determination circuit shown in FIG. 1.

As shown in FIG. 5, the address determination circuit 6 includes inverters 35 to 40, AND gates 41 to 43, clocked inverters 44 and 45 and NOR gates 46 and 47. For simplifying the illustration, only a part generating the signals TM1 and TM2 is described. The signal ext.A2 is input in first input nodes of the AND gates 41 and 42 through an input circuit 3a. The signal ext.A3 is input in a second input node of the AND gate 41 through an input circuit 3b, and input in a second input node of the AND gate 45 through the input circuit 3b and the inverter 35. The signal ext.A0 is input in a first input node of the AND gate 43 through an input circuit 3c and the inverter 36. The signal φSVIH is input in a second input node of the AND gate 43.

Output signals φ41 and φ42 of the AND gates 41 and 42 are input in first input nodes of the NOR circuits 46 and 47 through the clocked inverters 44 and 45. An output signal φ43 of the AND gate 43 is input in the gates of N-channel MOS transistors of the clocked inverters 44 and 45, and input in the gates of P-channel MOS transistors of the clocked inverters 44 and 45 through the inverters 37 and 38. The reset signal RES is input in second input nodes of the NOR gates 46 and 47. The inverters 39 and 40 are connected between output nodes and the first input nodes of the NOR gates 46 and 47 respectively. The NOR gates 46 and 47 output the test signals TM1 and TM2.

When the external address signals ext.A2 and ext.A3 are both high, i.e., when the combination is "11", the output signals φ41 and φ42 of the AND gates 41 and 42 go high and low respectively. When the external control signals ext.A2 and ext.A3 are high and low respectively, i.e., when the combination is "10", the output signals φ41 and φ42 of the AND gates 41 and 42 go low and high respectively. When the signals ext.A0 and φSVIH are low and high respectively, the clocked inverters 44 and 45 are activated and the signals φ41 and φ42 are input in the first input nodes of the NOR gates 46 and 47 through the clocked inverters 44 and 45.

The signal φ41 is latched by a latch circuit formed by the NOR gate 46 and the inverter 39 to form the test signal TM1. The signal φ42 is latched by a latch circuit formed by the NOR gate 47 and the inverter 40 to form the test signal TM2. When the signal φSVIH goes low, the signal φ43 also goes low and the clocked inverters 44 and 45 are inactivated. When the signal RES goes high, the signals TM1 and TM2 are reset low. The reset signal RES goes high at timing of CBR (CAS before RAS) or ROR (RAS only refresh).

The test signal TM3 goes high when the external address signals ext.A2 and ext.A3 go low and high respectively and the signal φ43 goes high. The test signal TM4 goes high when the external address signals ext.A2 and ext.A3 both go low and the signal φ43 goes high. When any of the test signals TM1 to TM4 goes high, the DRAM is set in the test mode responsive to the test signal.

Figure 6:
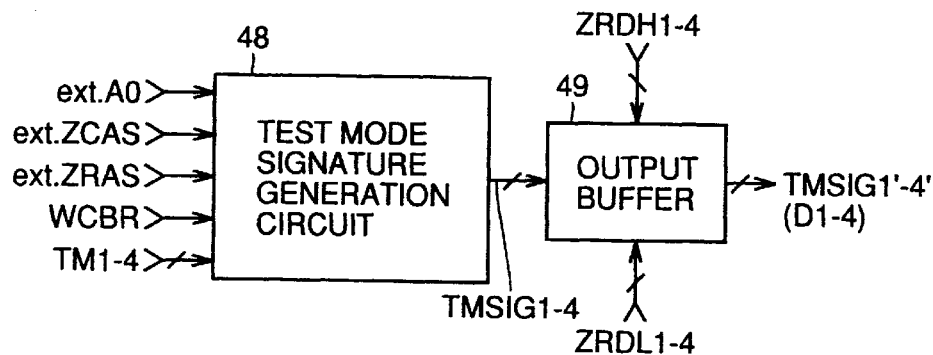
FIG. 6 is a block diagram showing the structure of a part f the DRAM illustrated in FIG. 1 related to generation and output of test mode signatures.

FIG. 6 is a block diagram showing the structure of a part of this DRAM related to generation and output of test mode signatures. Referring to FIG. 6, the DRAM comprises a test mode signature generation circuit 48 and an output buffer 49. It is assumed that the bit number n of data which can be simultaneously input/output is 4.

The test mode signature generation circuit 48 is activated responsively when the signals WCBR and ext.A0 both go high for outputting the test signals TM1 to TM4 as test mode signatures TMSIG1 to TMSIG4, and inactivated responsively when the external control signal ext.ZCAS goes high while the external control signal ext.ZRAS is low for fixing the test mode signatures TMSIG1 to TMSIG4 low.

Figure 7:
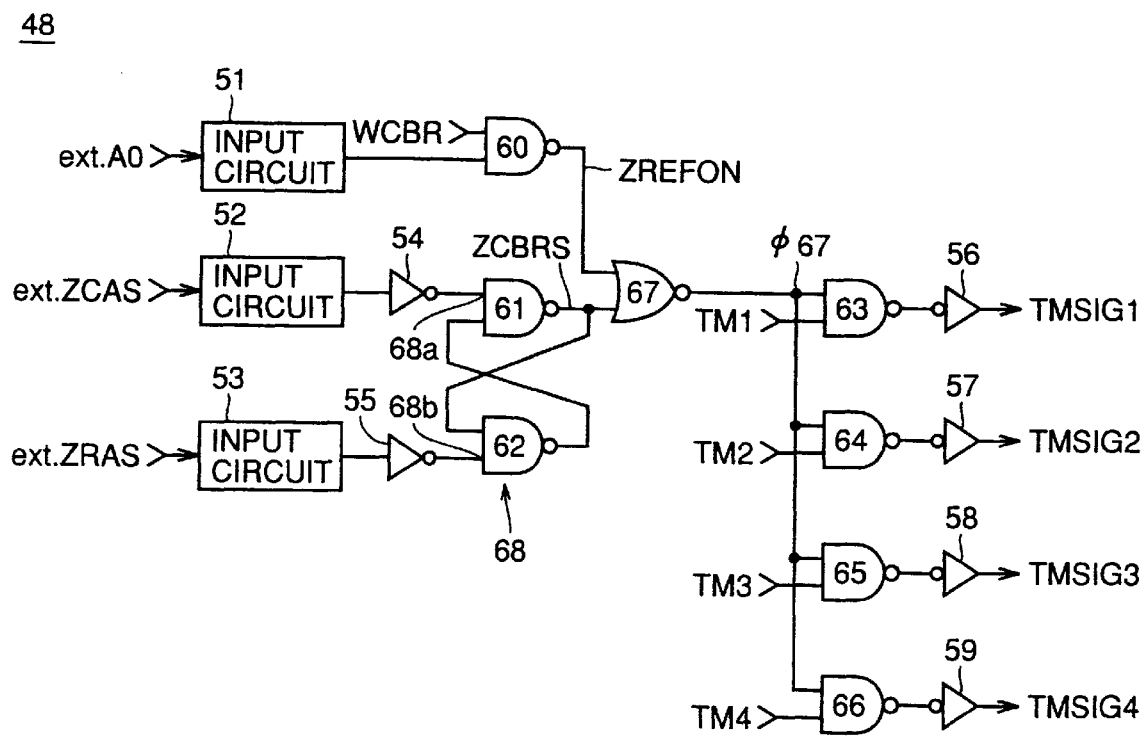
FIG. 7 is a circuit block diagram showing the structure of a test mode signature generation circuit shown in FIG. 6.

As shown in FIG. 7, the test mode signature generation circuit 48 includes input circuits 51 to 53, inverters 54 to 59, NAND gates 60 to 66 and a NOR gate 67, and the NAND gates 61 and 62 form a flip-flop 68. The signal WCBR is input in a first input node of the NAND gate 60. The signal ext.A0 is input in a second input node of the NAND gate 60 through the input circuit 51. The signal ext.ZCAS is input in a set terminal 68a of the flip-flop 68 through the input circuit 52 and the inverter 54. The signal ext.ZRAS is input in a reset terminal 68b of the flip-flop 68 through the input circuit 53 and the inverter 55.

The NOR gate 67 receives an output signal ZREFON from the NAND gate 60 and an output signal ZCBRS from the flip-flop 68, and its output signal is input in first input nodes of the NAND gate 63 to 66. The signals TM1 to TM4 are input in second input nodes of the NAND gates 63 to 66 respectively. Output signals from the NAND gates 63 to 66 are inverted in the inverters 56 to 59 respectively, to form the test mode signatures TMSG1 to TMSIG4.

When the signals WCBR and ext.A0 are both high, the signal ZREFON goes low for activation. When the signals ext.ZRAS and ext.ZCAS are both high, the signal ZCBRS goes high. When the signal ext.ZCAS goes low while the signal ext.ZRAS is high, the flip-flop 68 is reset and the signal ZCBRS goes low for activation. When the signal ext.ZRAS goes low while the signal ext.ZCAS is high, the flip-flop 68 is set and the signal ZCBRS goes high for inactivation. When the signals ext.ZRAS and ext.ZCAS both go low, the signal ZCBRS remains unchanged.

When at least one of the signals ZREFON and ZCBRS is high, an output signal φ67 of the NOR gate 67 goes low and all test mode signatures TMSIG1 to TMSIG4 are fixed low. When the signals ZREFON and ZCBRS are both low, the output signal φ67 of the NOR gate 67 goes high and the signals TM1 to TM4 form the test mode signatures TMSIG1 to TMSIG4 respectively.

In this DRAM, the test mode signatures TMSIG1 to TMSIG4 are not output so far as the external address signal ext.A0 is kept low, whereby the test mode signatures TMSIG1 to TMSIG4 can be prevented from colliding with read data.

The output buffer 49 outputs data signals D1 to D4 in accordance with internal data signals ZRDH1 to ZRDH4 and ZRDL1 to ZRDL4 in a general read mode, while outputting test mode signatures TMSIG1' to TMSIG4' in accordance with the test mode signatures TMSIG1 to TMSIG4 in a test mode.

Figure 8:
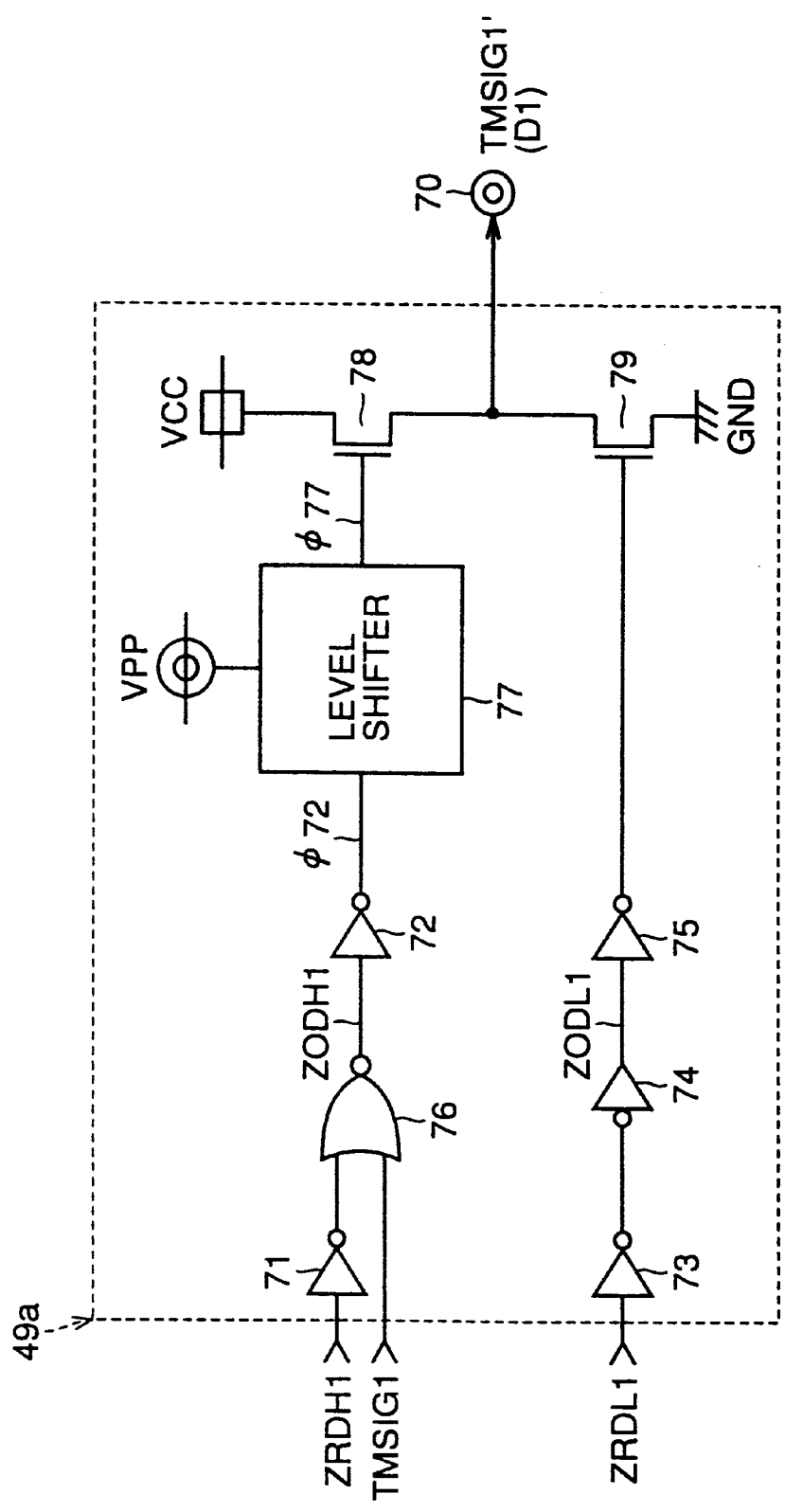
FIG. 8 is a circuit diagram showing the structure of a buffer included in an output buffer shown in FIG. 6.

As shown in FIG. 8, the output buffer 49 includes a buffer 49a provided in correspondence to the signals ZRDH1 and ZRDL1 and the test mode signature TMSIG1. In addition to the buffer 49a, the output buffer 49 includes three buffers provided in correspondence to the signals ZRDH2, ZRDL2 and TMSIG2, . . . , ZRDH4, ZRDL4 and TMSIG4 respectively. The four buffers are identical in structure to each other, and hence only the buffer 49a is described.

The buffer 49a includes inverters 71 to 75, a NOR gate 76, a level shifter 77 and N-channel MOS transistors 78 and 79. The N-channel MOS transistor 78 is connected between a line of the power supply potential VCC and a data input/output terminal 70 for the data signal D1. The N-channel MOS transistor 79 is connected between the data input/output terminal 70 and a line of the ground potential GND. The signal ZRDH1 is input in a first input node of the NOR gate 76 through the inverter 71. The signal TMSIG1 is input in a second input node of the NOR gate 76. An output signal ZODH1 of the NOR gate 76 is input in the gate of the N-channel MOS transistor 78 through the inverter 72 and the level shifter 77. The signal ZRDL1 is input in the gate of the N-channel MOS transistor 79 through the inverters 73 to 75.

Figure 9:
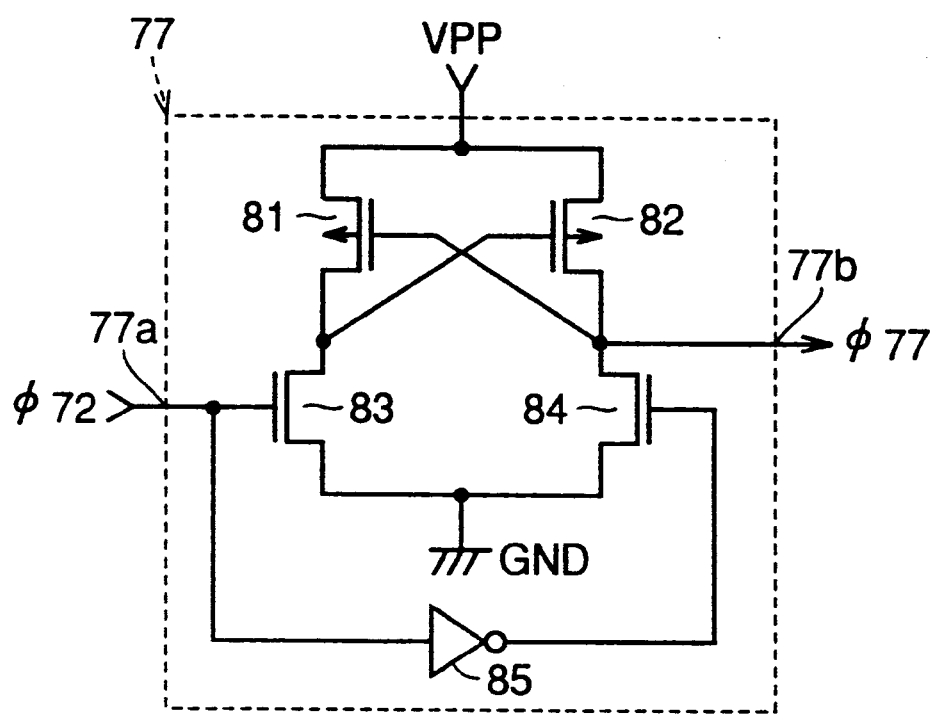
FIG. 9 is a circuit diagram showing the structure of a level shifter shown in FIG. 8.

As shown in FIG. 9, the level shifter 77 includes P-channel MOS transistors 81 and 82, N-channel MOS transistors 83 and 84 and an inverter 85. The MOS transistors 81 and 83 as well as 82 and 84 are serially connected between a line of a step-up potential VPP and a line of the ground potential GND respectively. The gates of the P-channel MOS transistors 81 and 82 are connected to the drains of the P-channel MOS transistors 82 and 81 respectively. An input node 77a is directly connected to the gate of the N-channel MOS transistor 83 and connected to the gate of the N-channel MOS transistor 84 through the inverter 85. The drain of the P-channel MOS transistor 82 forms an output node 77b of the level shifter 77. The step-up potential VPP is generated by a VPP generation circuit stored in the DRAM. The VPP generation circuit generates the step-up potential VPP by stepping up the power supply potential VCC.

When an input signal φ72 is low, the MOS transistors 81 and 84 are rendered conductive, the MOS transistors 82 and 83 are rendered nonconductive and an output signal φ77 reaches the ground potential GND. When the input signal φ72 is high, the MOS transistors 82 and 83 are rendered conductive, the MOS transistors 81 and 84 are rendered non-conductive and the output signal φ77 reaches the step-up potential VPP.

Referring again to FIG. 8, the output signal ZODH1 of the NOR gate 76 goes low, the output signal φ77 from the level shifter 77 reaches the step-up potential VPP, the N-channel MOS transistor 78 is rendered conductive and the data input/output terminal 70 reaches the power supply potential VCC when the signal ZRDH1 goes low for activation or the test mode signature TMSIG1 goes high for activation. When the signal ZRDL1 goes low for activation, the output signal ZODL1 of the inverter 74 goes low, the N-channel MOS transistor 79 is rendered conductive and the data input/output terminal 70 reaches the ground potential GND.

In this buffer 49a, the signal ZRDH1 and the test mode signature TMSIG1 share the level shifter 77 and the N-channel MOS transistor 78, whereby the layout area of the buffer 49a may be small and the test mode signature TMSIG1' of the power supply potential VCC can be output.

Figure 10:
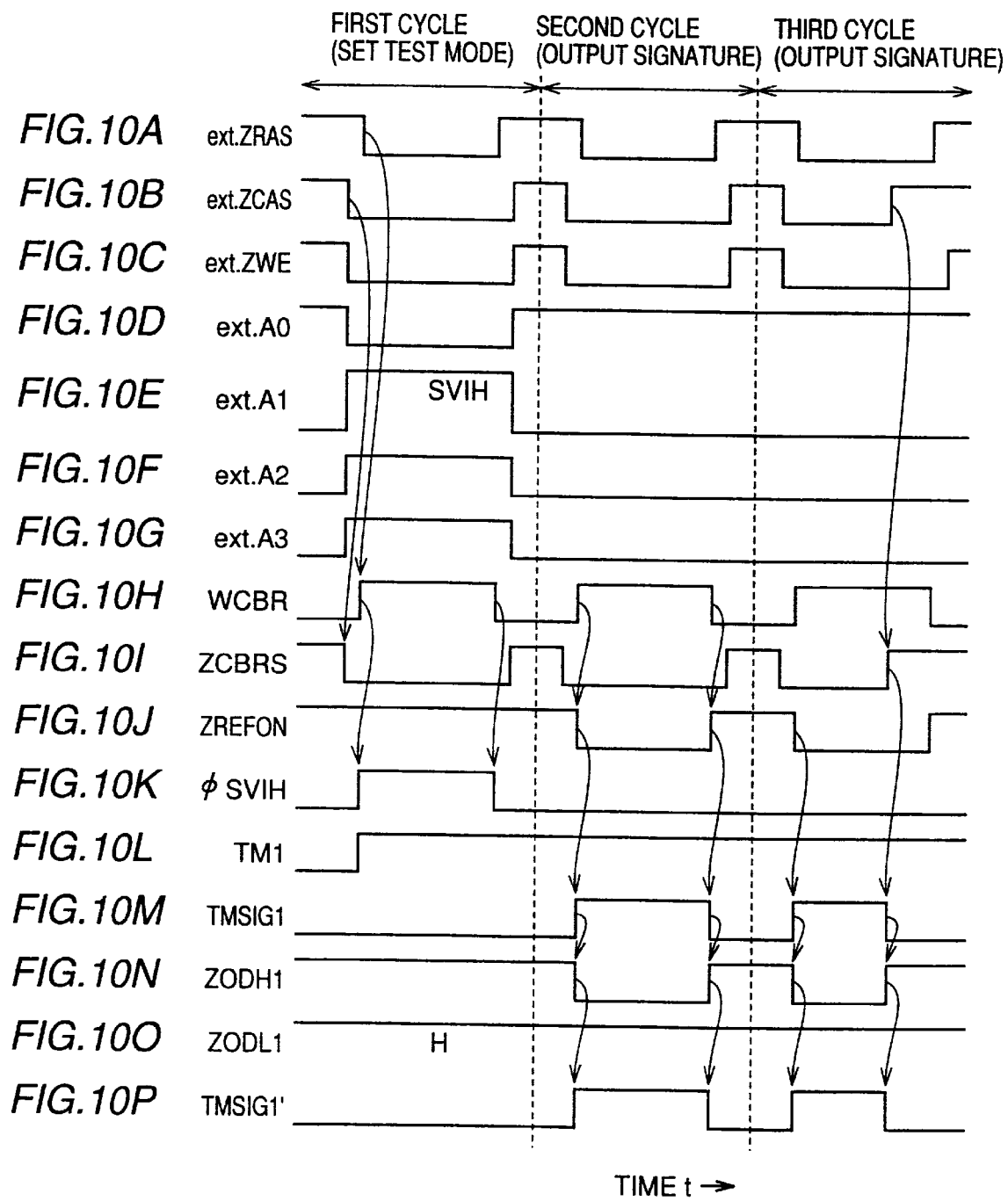
FIGS. 10A to 10P are timing charts showing operations of the part of the DRAM shown in FIGS. 1 to 9 related to the test mode signatures.

FIGS. 10A to 10P are timing charts showing operations of the part, related to the test mode signatures, of the DRAM shown in FIGS. 1 to 9. For simplifying the illustration, only operations of the part related to the test mode signature TMSIG1 are described.

In the first cycle, the test mode is set. The signals ext.ZRAS, ext.ZCAS and ext.ZWE fall low at the timing of WCBR, and the signal WCBR goes high while the signal ZCBRS goes low in response thereto.

The super VIH determination circuit 5 is activated when the signal WCBR goes high, and the signal φSVIH goes high when the super VIH level SVIH is supplied to the terminal for the external address signal ext.A1. The address determination circuit 6 is activated when the signal ext.A0 falls low, while the signal TMI goes high and is latched when the signals ext.A2 and ext.A3 are both high. The signal ext.A0 is low and hence the test mode signature generation circuit 48 is not activated, the test mode signature TMSIG1 is fixed low and the output signal TMSIG1' of the buffer 49a also remains low. When the signals ext.ZRAS, ext.ZCAS and ext.ZWE rise high, the signals WCBR and φVIH go low and the signal ZCBRS goes high.

In the second cycle, the test mode signature TMSIG1' is output. The signals ext.ZRAS, ext.ZCAS and ext.ZWE fall low at the timing of WCBR, and the signal WCBR goes high while the signal ZCBRS goes low in response thereto.

The super VIH determination circuit 5 is activated when the signal WCBR goes high, while the terminal for the external address terminal ext.A1 is supplied with a low level and the signal φSVIH remains low. Therefore, the address determination circuit 6 is not activated and the test signal TM1 remains high. The signal ext.A0 is set high, the test mode signature generation circuit 48 is activated and the test mode signature TMSIG1 goes high. In response thereto, the output signal ZODHL from the NOR gate 76 shown in FIG. 8 goes low and the output signal TMSIG1' of the buffer 49a goes low. When the signals ext.ZRAS, ext.ZCAS and ext.ZWE rise high, the signal WCBR goes low, the signal ZREFON goes high, the test mode signature generation circuit 48 is inactivated and the test mode signature TMSIG1' goes low.

In the third cycle, the signal WCBR goes high, the signals ZCBRS and ZREFON also go high and the test mode signature TMSIG1' goes high similarly to the second cycle. When the signal ext.ZCAS rises high in this state, the signal ZCBRS goes high, the test mode signature generation circuit 48 is inactivated and the test mode signature TMSIG1' goes low.

According to this embodiment, output of the test mode signature TMSIG1 is stopped when the signal ext.ZCAS rises in advance of the signal ext.ZRAS, thereby preventing the test mode signature TMSIG1' from colliding with read data D1. The point preventing the test mode signature TMSIG1' from colliding with the read data D1 is now described in more detail.

Figure 15:
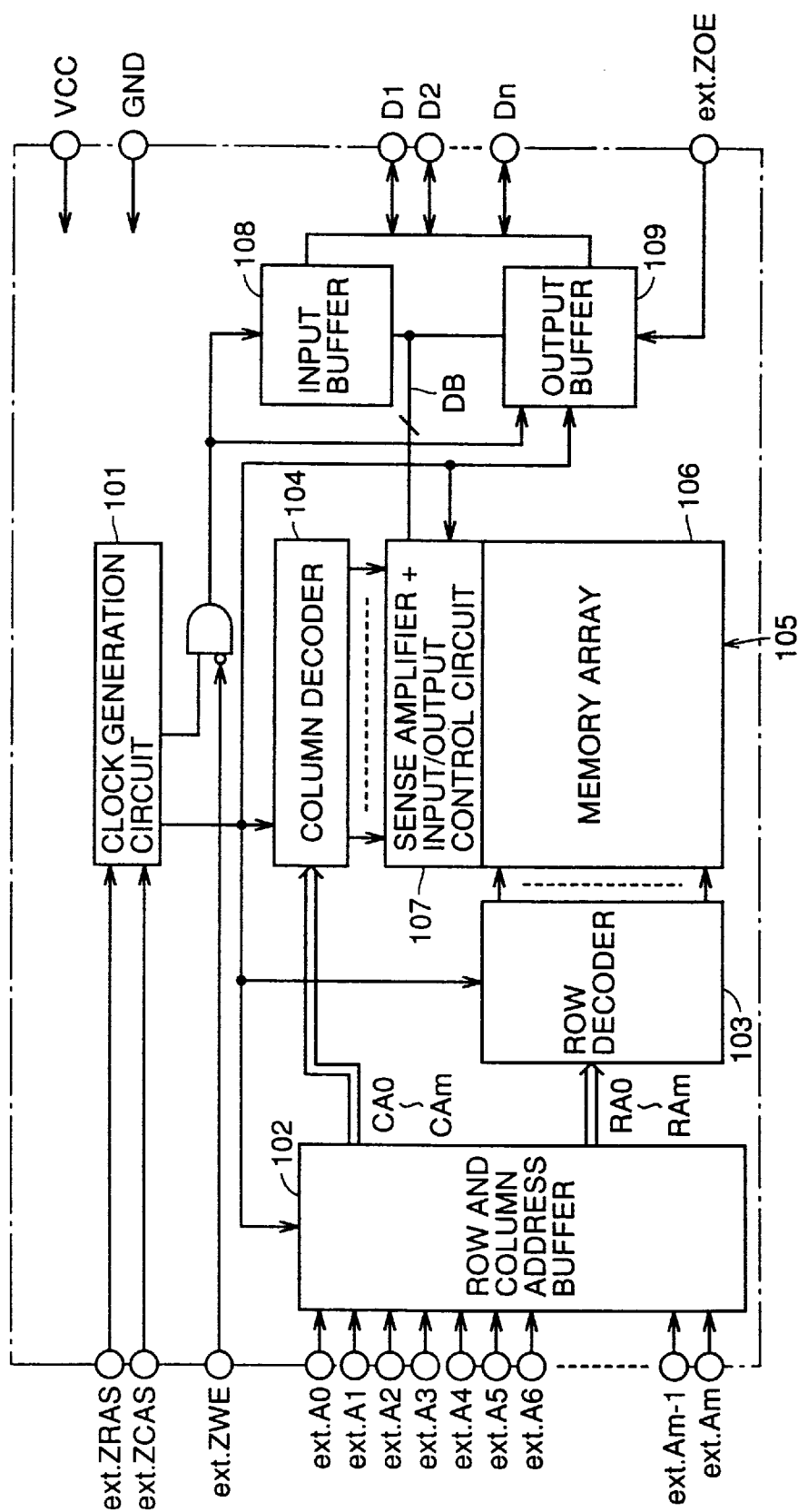
FIG. 15 is a block diagram showing the overall structure of a conventional DRAM.
Figure 16:
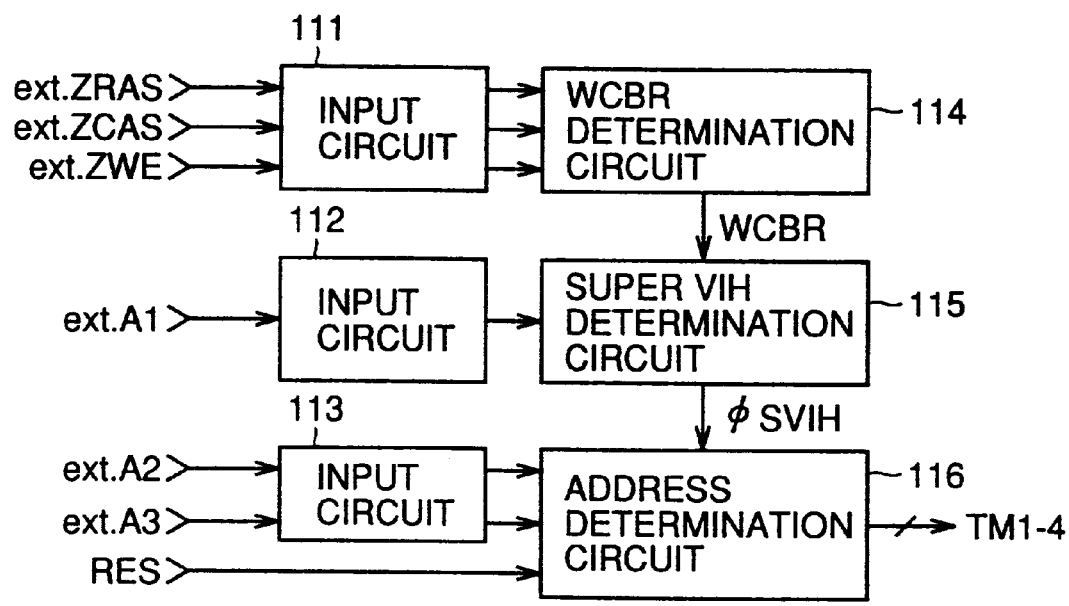
FIG. 16 is a block diagram showing the structure of a part related to setting of a test mode included in the DRAM shown in FIG. 15.
Figure 17:
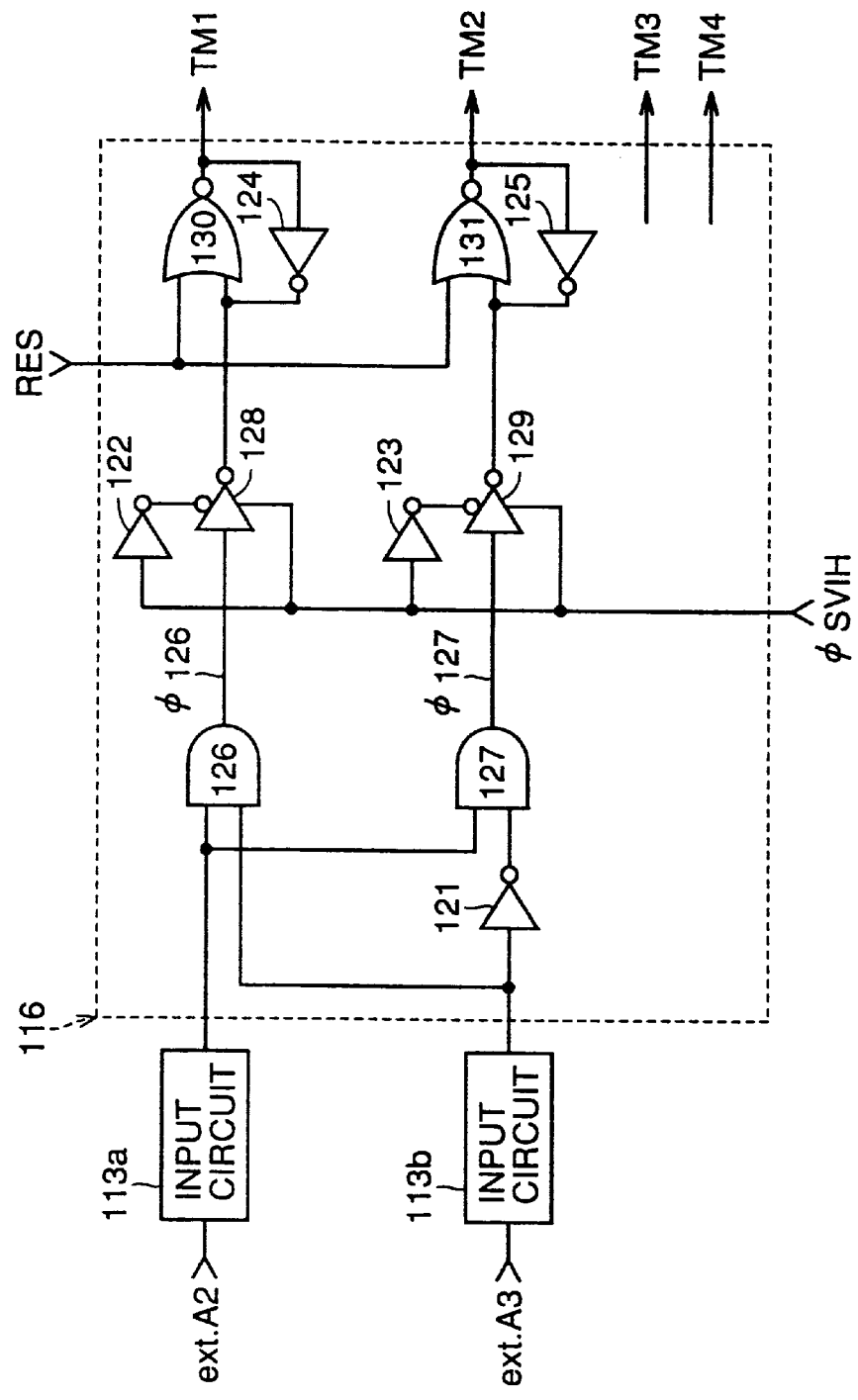
FIG. 17 is a circuit diagram showing the structure of an address determination circuit shown in FIG. 16.
Figure 18:
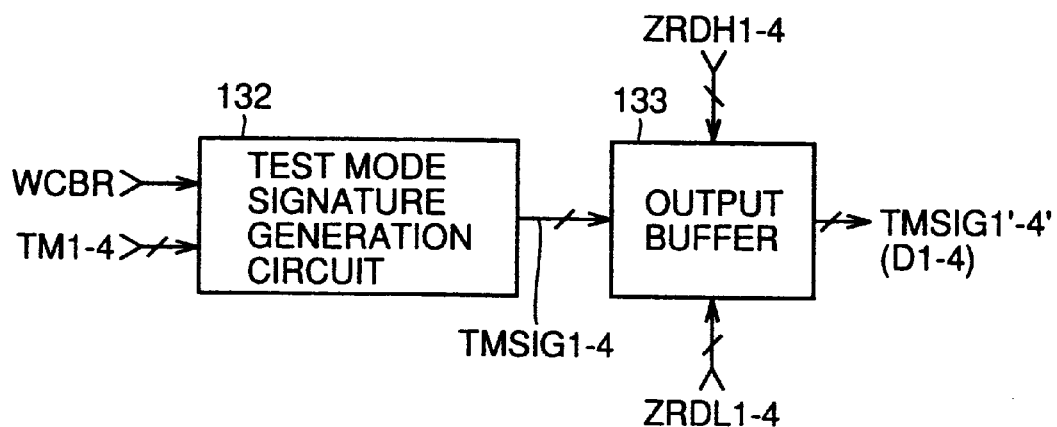
FIG. 18 is a block diagram showing a part related to generation and output of test mode signatures included in the DRAM shown in FIG. 15.
Figure 19:
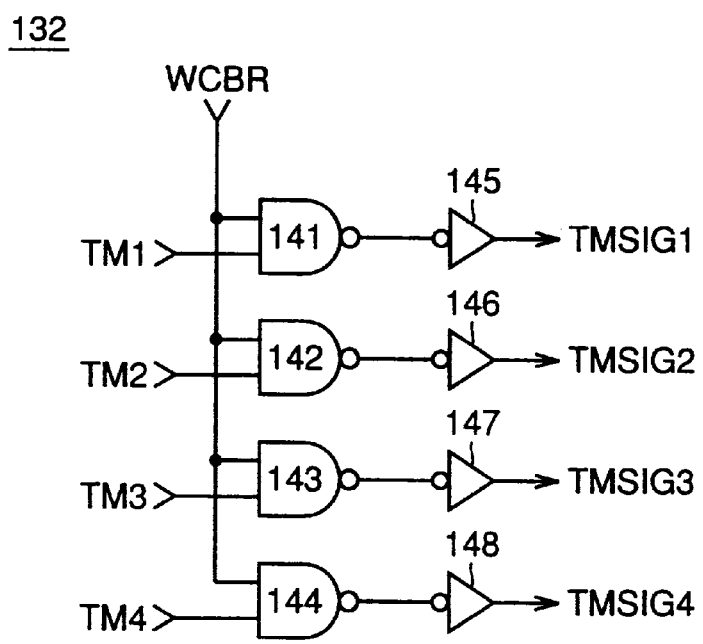
FIG. 19 is a circuit diagram showing the structure of a test mode signature generation circuit shown in FIG. 18.

FIG. 11 is a block diagram showing a write/read control circuit 86 included in the sense amplifier+input/output control circuit 107 shown in FIG. 15. The write/read control circuit 86 is activated when the signal ZCBRS is high for setting one of the signals ZRDH1 and ZRDL1 high and setting the remaining one low in accordance with read data RD from the memory array 106. When the signal ZCBRS is low, the write/read control circuit 86 is inactivated and the signals ZRDH1 and ZRDH1 both go high.

Referring to FIGS. 12A to 12K, it is assumed that the signals ext.ZRAS, ext.ZCAS and ext.ZWE fall low at the timing of WCBR, the signals ZCBRS and WCBR go low and high respectively, the signal TM1 goes high and the test mode signature TMSIG1 goes high in common to the prior art and the present invention.

When the signals ext.ZCAS and ext.ZWE rise high in advance of the signal ext.ZRAS, the signal ZCBRS goes high and the write/read control circuit 86 is activated. When the signal ext.ZCAS then falls low, one of the signals ZRDH1 and ZRDL1 goes high and the remaining one goes low in accordance with the read data RD from the memory array 106.

Figure 20:
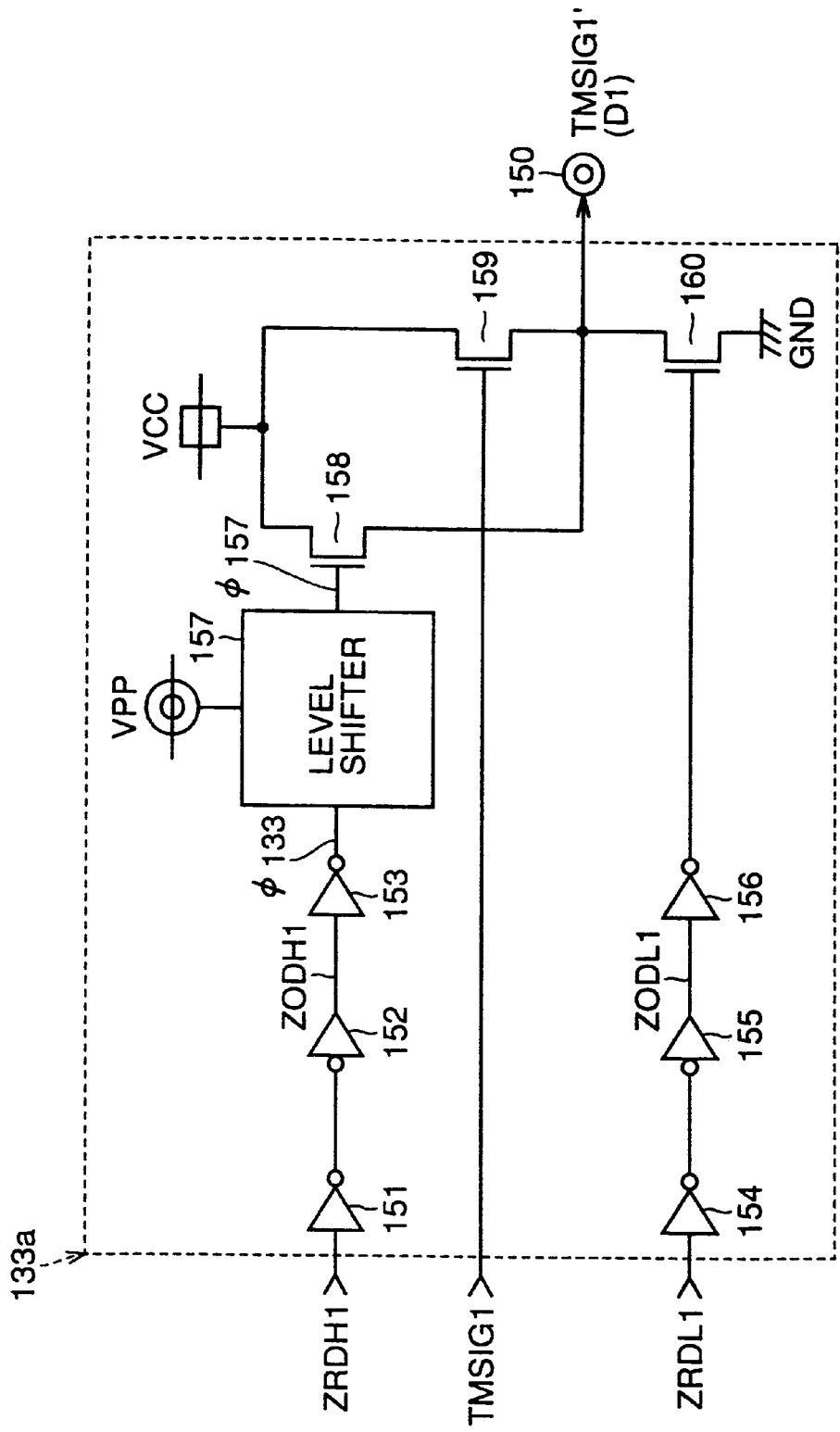
FIG. 20 is a circuit block diagram showing the structure of a buffer included in an output buffer shown in FIG. 18.
Figure 21:
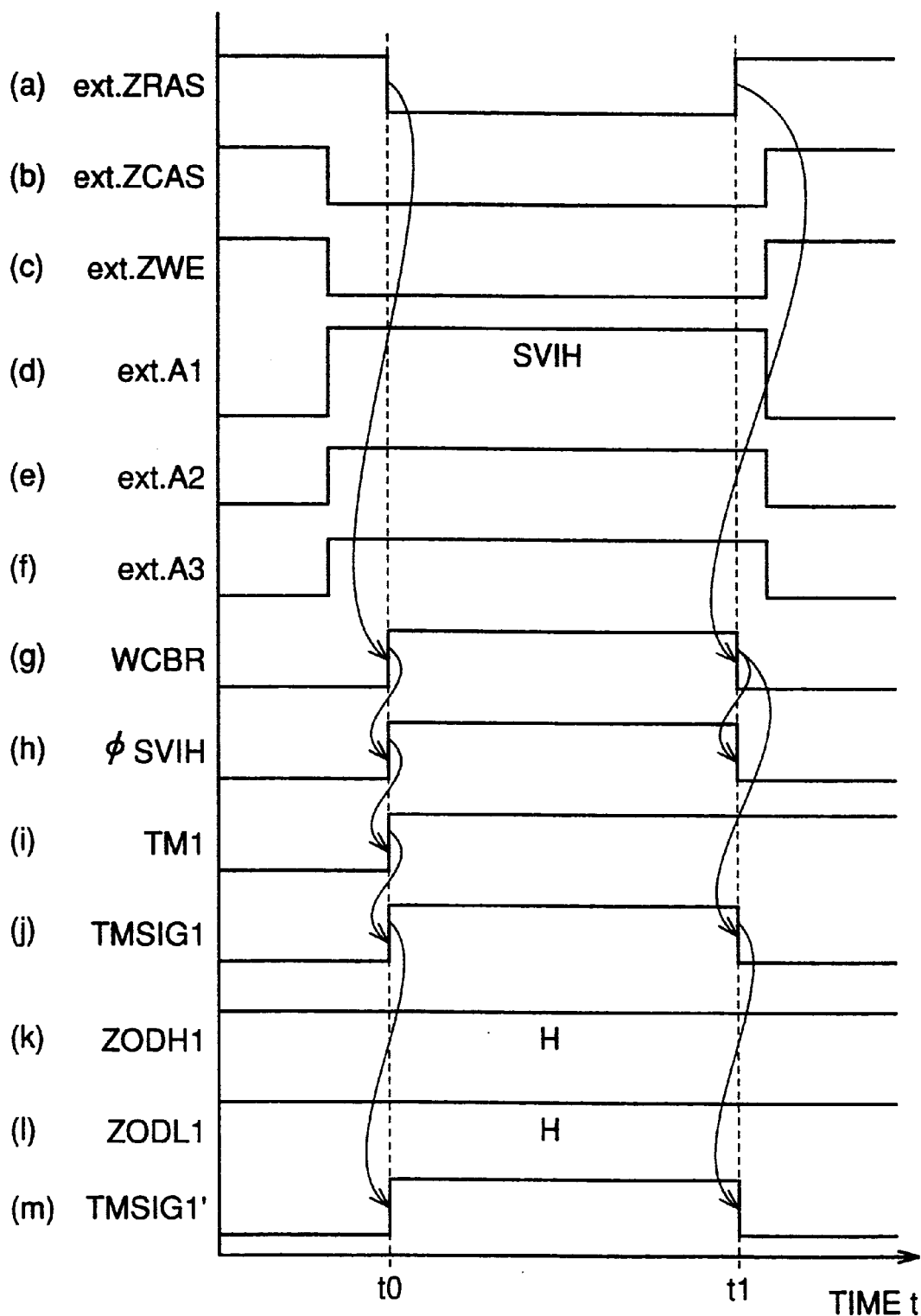
FIG. 21 is a timing chart showing operations of the part related to test mode signatures shown in FIGS. 16 to 20.

In the conventional DRAM, the read data D1 collides with the test mode signature TMSIG1 when the signal ZRDL1 goes low and the signal TM1 goes high. In the buffer 133a shown in FIG. 20, the N-channel MOS transistors 159 and 160 are both rendered conductive when the signal ZRDL1 goes low and the signal TMSIG1 goes high, and a through current flows from the line of the power supply potential VCC to the line of the ground potential GND through the N-channel MOS transistors 159 and 160.

In the DRAM according to the present invention, the test mode signature generation circuit 48 is inactivated and the test mode signature TMSIG1 goes low when the signal ext.ZCAS rises high in advance of the signal ext.ZRAS and the signal ZCBRS goes high. Therefore, only the N-channel MOS transistor 79 is rendered conductive in the N-channel MOS transistors 78 and 79 of the buffer 49a, whereby no through current flows.

Figure 13:
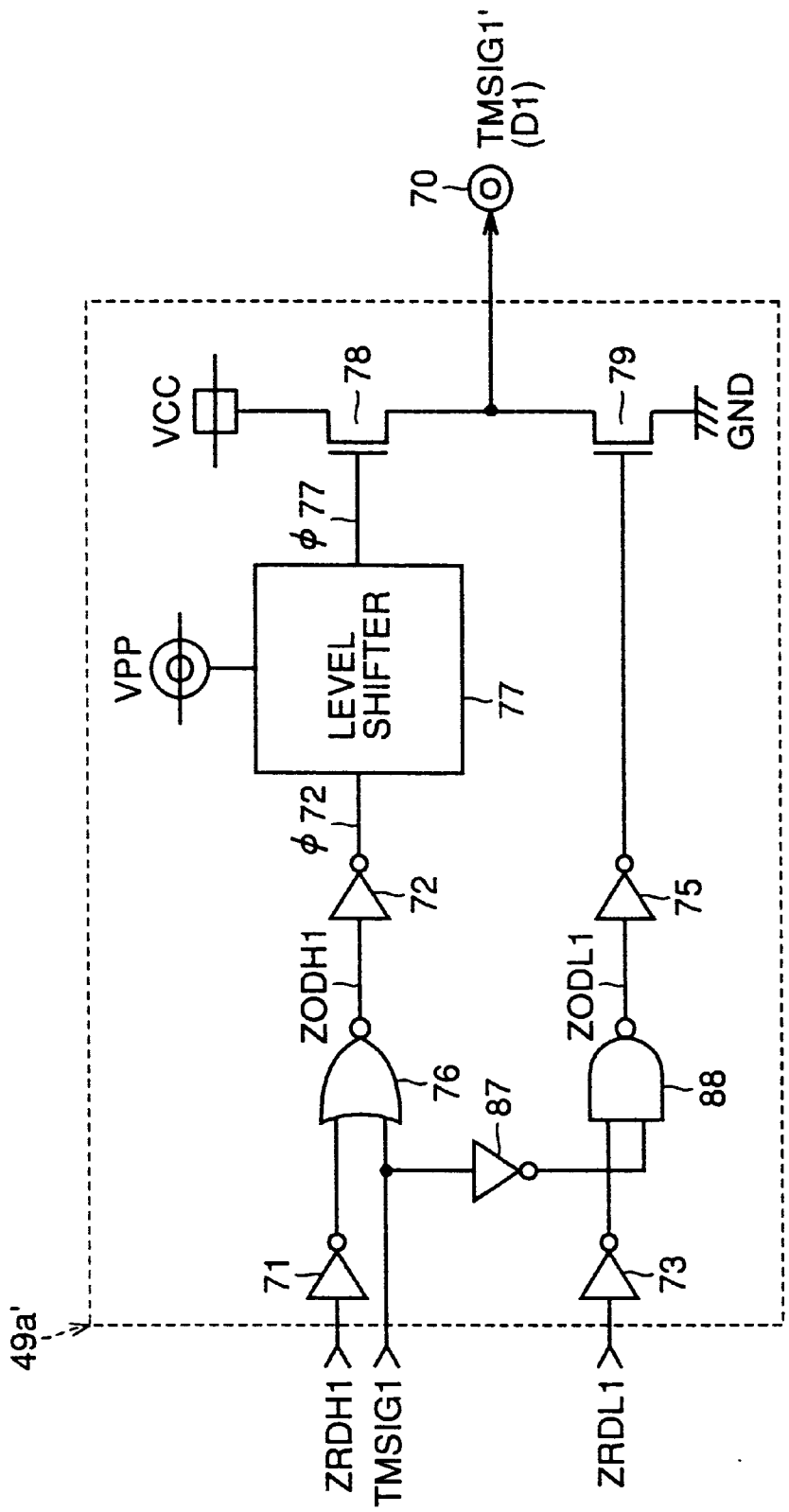
FIG. 13 is a circuit block diagram showing a modification of the embodiment.

FIG. 13 is a circuit block diagram showing the structure of an output buffer 49a' of a DRAM according to a first modification of this embodiment in contrast with FIG. 8. Referring to FIG. 13, the output buffer 49a' is different from the output buffer 49a shown in FIG. 8 in a point that an inverter 87 and a NAND gate 88 are provided in place of the inverter 74. A test mode signature TMSIG1 is input in a first input node of the NAND gate 88 through the inverter 87. A signal ZRDL1 is input in a second input node of the NAND gate 88 through an inverter 73. An output signal ZODL1 of the NAND gate 88 is input in the gate of an N-channel MOS transistor 79 through an inverter 75.

When the test mode signature TMSIG1 goes high, the output signal ZODL1 of the NAND gate 88 is fixed high. Therefore, the N-channel MOS transistor 79 is not rendered conductive and no through current flows even if the signal ZRDL1 goes low while the test mode signature TMSIG1 is high. According to the first modification, flow of a through current can be more reliably prevented.

Figure 14:
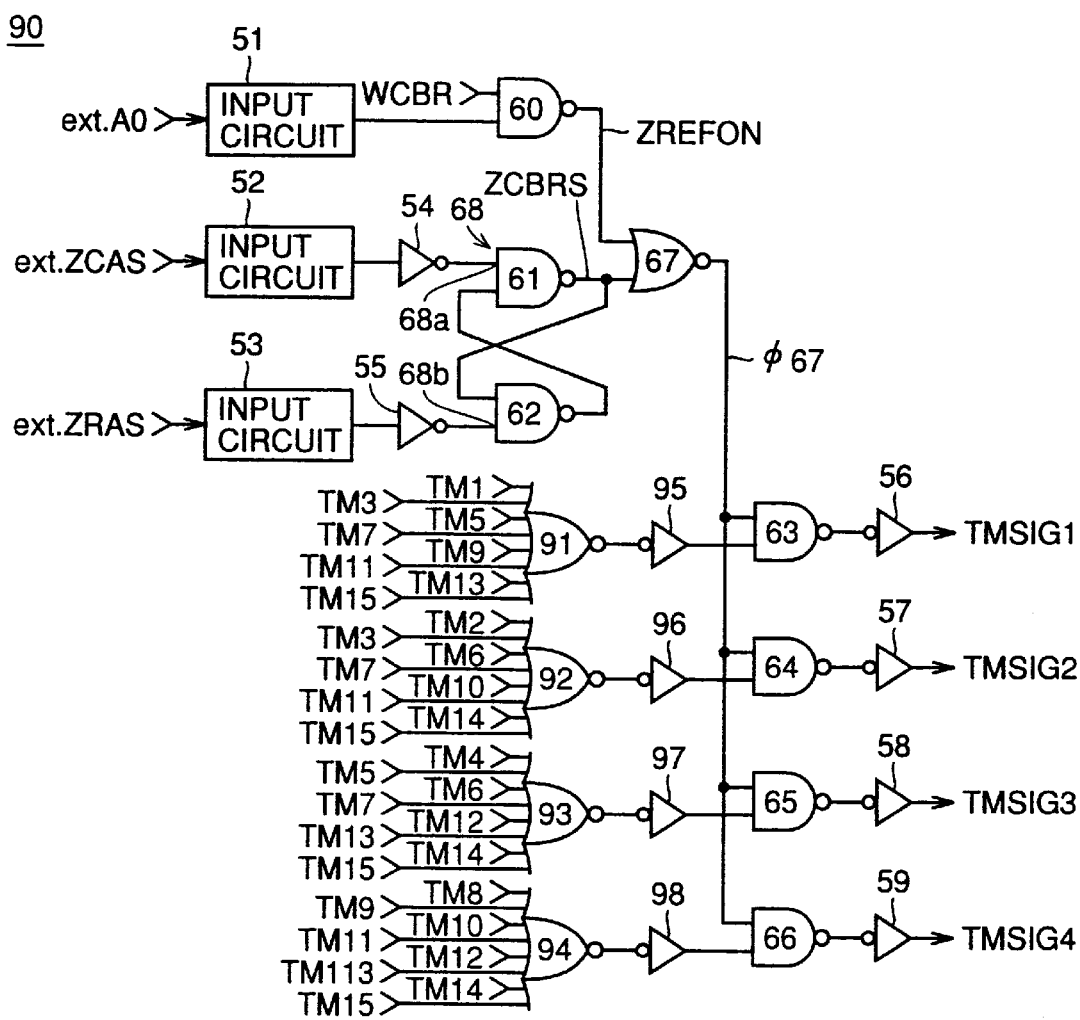
FIG. 14 is a circuit block diagram showing another modification of the embodiment.

FIG. 14 is a circuit block diagram showing the structure of a test mode signature generation circuit 90 of a DRAM according to a second modification of the embodiment in contrast with FIG. 7. Referring to FIG. 14, the test mode signature generation circuit 90 is different from the test mode signature generation circuit 48 shown in FIG. 7 in a point that NOR gates 91 to 94 and inverters 95 to 98 are added.

This DRAM can set 16 types of test modes through combination (0000 to 1111) of the logical levels of four external address signals (e.g., ext.A2 to ext.A5). Signals TM1 to TM16 are generated in correspondence to the 16 types of test modes. An address determination circuit similar in structure to the address determination circuit 6 shown in FIG. 5 generates the signals TM1 to TM16. The NOR gate 91 receives the odd signals TM1, TM3, . . . , TM15. The NOR gate 92 receives the signals TM2, TM3, TM6, TM7, TM10, TM11, TM14 and TM15. The NOR gate 93 receives the signals TM4 to TM7 and TM12 to TM15. The NOR gate 94 receives the signals TM8 to TM15. Output signals from the NOR gates 91 to 94 are inverted by the inverters 95 to 98 respectively and input in second input nodes of NAND gates 63 to 67.

When a signal φ67 goes high, the test mode signature generation circuit 90 is activated and the test signals TM1 to TM15 pass through the NOR gates 91 to 94, the inverters 95 to 98, the NAND gates 63 to 66 and inverters 56 to 59 to form test mode signatures TMSIG1 to TMSIG4. 15 types of test mode signatures can be output through combination (0001 to 1111) of the logical levels of the for test mode signatures TMSIG1 to TMSIG4.

For example, the test mode signature TMSIG1 goes high and the test mode signatures TMSIG2 to TMSIG4 go low (0001) when the signal TM1 is high and the signals TM2 to TM15 are low, while all test mode signatures TMSIG1 to TMSIG4 go high (1111) when the signals TM1 to TM14 are low and the signal TM15 is high. Regarding that signature output is made also when all test mode signatures TMSIG1 to TMSIG4 are low (0000), the four-bit test mode signatures TMSIG1 to TMSIG4 specify 16 types of test modes.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a test mode, comprising:

a memory array including a plurality of memory cells;

a read circuit selecting any memory cell among said plurality of memory cells in accordance with a plurality of external address signal and reading data from said memory cell in a read mode;

a first signal generation circuit activating a first internal data signal responsively when said data read by said read circuit has first logic and activating a second internal data signal responsively when said data has second logic;

a second signal generation circuit activating a test mode signature responsively when said test mode is set; and an output buffer setting a data output terminal to a first logical level in response to activation of at least either said first internal data signal or said test mode signature and setting said data output terminal to a second logical level in response to activation of said second internal data signal, wherein said output buffer includes:

a logic circuit activating a third internal data signal in response to activation of at least either said first internal data signal or said test mode signature, a first transistor connected between a line of a first power supply potential and said data output terminal and rendered conductive in response to activation of said third internal data signal, and a second transistor connected between said data output terminal and a line of a second power supply potential and rendered conductive in response to activation of said second internal data signal.

2. The semiconductor memory device according to claim 1, wherein said output buffer further includes a step-up potential generation circuit supplying a step-up potential stepped up from said first power supply potential to an input electrode of said first transistor for rendering said first transistor conductive in response to activation of said third internal data signal.

3. The semiconductor memory device according to claim 1, wherein said output buffer further includes a control circuit fixing said second transistor to a non-conductive state in response to activation of said test mode signature also when said second internal data signal is active.

4. The semiconductor memory device according to claim 1, wherein said memory array, said read circuit, said first signal generation circuit and said output buffer are provided in N sets (N: integer of at least 2), and said second signal generation circuit includes:

first to N-th address determination circuits activating first to N-th test signals for setting first to N-th test modes responsively when a plurality of predetermined external address signals among said plurality of external address signals are set to combination of predetermined first to N-th logical levels respectively, and a test mode signature generation circuit supplying said first to N-th test signals to said N output buffers as first to N-th test mode signatures respectively.

5. The semiconductor memory device according to claim 1, wherein said memory array, said read circuit, said first signal generation circuit and said output buffer are provided in N sets (N: integer of at least 2), and said second signal generation circuit includes:

first to M-th A: integer greater than N) address determination circuits activating first to M-th test signals for setting first to M-th test modes responsively when a plurality of predetermined external address signals among said plurality of external address signals are set to combination of predetermined first to M-th logical levels respectively, and a test mode signature generation circuit generating N-bit test mode signatures indicating the number of activated test signal among said first to M-th test signals and supplying said N-bit test mode signatures to said N output buffers respectively.

6. A semiconductor memory device controlled by first to third external control signals and a plurality of external address signals, comprising:

a memory array including a plurality of memory cells;

a read circuit activated in response to activation of said second external control signal after activation of said first external control signal for selecting any memory cell among said plurality of memory cells in accordance with said plurality of external address signals and reading data from said memory cell;

a first signal generation circuit activating a first internal data signal responsively when said data read by said read circuit has first logic and activating a second internal data signal responsively when said data has second logic;

a second signal generation circuit activated in response to activation of said first external control signal after activation of said second and third external control signals for activating a test mode signature indicating that a test mode is set responsively when a plurality of predetermined external address signals among said plurality of external address signals are set to combination of predetermined logical levels and inactivating said test mode signature in response to inactivation of said second external control signal; and an output buffer setting a data output terminal to a first logical level in response to activation of at least either said first internal data signal or said test mode signature and setting said data output terminal to a second logical level in response to activation of said second internal data signal.

7. The semiconductor memory device according to claim 6, wherein said second signal generation circuit includes:

an address determination circuit activating a test signal for setting said test mode responsively when said plurality of predetermined external address signals are set in said combination of said predetermined logical levels, and a test mode signature generation circuit supplying said test signal output from said address determination circuit to said output buffer as said test mode signature and inactivating said test mode signature in response to inactivation of said second external control signal when said first external control signal is active.

8. The semiconductor memory device according to claim 6, wherein said memory array, said read circuit, said first signal generation circuit and said output buffer are provided in N sets (N: integer of at least 2), and said second signal generation circuit includes:

first to N-th address determination circuits activating first to N-th test signals for setting first to N-th test modes responsively when said plurality of predetermined external address signals are set to combination of predetermined first to N-th logical levels respectively, and a test mode signature generation circuit supplying said first to N-th test signals output from said first to N-th address determination circuits to said N output buffers as first to N-th test mode signatures respectively and inactivating said first to N-th test mode signatures in response to inactivation of said second external control signal when said first external control signal is active.

9. The semiconductor memory device according to claim 6, wherein said memory array, said read circuit, said first signal generation circuit and said output buffer are provided in N sets (N: integer of at least 2), and said second signal generation circuit includes:

first to M-th (M:integer greater than N) address determination circuits activating first to M-th test signals for setting first to M-th test modes responsively when said plurality of predetermined external address signals are set to combination of predetermined first to M-th logical levels respectively, and a test mode signature generation circuit generating N-bit test mode signatures indicating the number of activated test signal among said first to M-th test signals and supplying said N-bit test mode signatures to said N output buffers respectively and inactivating each of said N-bit test mode signatures in response to inactivation of said second external control signal when said first external control signal is active.

10. A semiconductor memory device controlled by first to third external control signals and a plurality of external address signals, comprising:

a memory array including a plurality of memory cells;

a read circuit activated in response to activation of said second external control signal after activation of said first external control signal for selecting any memory cell among said plurality of memory cells in accordance with said plurality of external address signals and reading data from said memory cell;

a first signal generation circuit activating a first internal data signal responsively when said data read by said read circuit has first logic and activating a second internal data signal responsively when said data has second logic;

a second signal generation circuit activated in response to activation of said first external control signal after activation of said second and third external control signals for activating a test mode signature indicating that a test mode is set responsively when a plurality of predetermined external address signals among said plurality of external address signals are set to combination of predetermined logical levels; and an output buffer setting a data output terminal to a first logical level in response to activation of at least either said first internal data signal or said test mode signature and setting said data output terminal to a second logical level in response to activation of said second internal data signal, wherein said second signal generation circuit includes:

an address determination circuit activated in a test mode set period activating a first internal control signal for activating a test signal for setting said test mode responsively when said plurality of predetermined external address signals are set to said combination of said predetermined logical levels, and a test mode signature generation circuit activated in a test mode signature output period activating a second internal control signal for supplying said test signal output from said address determination circuit to said output buffer as said test mode signature.

11. The semiconductor memory device according to claim 10, wherein said second signal generation circuit further includes an internal control signal generation circuit activated in response to activation of said first external control signal after activation of said second and third external control signals for activating said first internal control signal responsively when a predetermined external address signal other than said plurality of predetermined external address signals among said plurality of external address signals is set to said first logical level and activating said second internal control signal responsively when said predetermined external address signal is set to said second logical level.

12. The semiconductor memory device according to claim 11, wherein said internal control signal generation circuit inactivates said second internal control signal in response to inactivation of said second external control signal when said first external control signal is active also when said predetermined external address signal is set to said second logical level.

13. The semiconductor memory device according to claim 10, wherein said memory array, said read circuit, said first signal generation circuit and said output buffer are provided in N sets (N: integer of at least 2), and said second signal generation circuit includes:

first to N-th address determination circuits activated in said test mode set period for activating first to N-th test signals for setting first to N-th test modes responsively when said plurality of predetermined external address signals are set to combination of predetermined first to N-th logical levels respectively, and a test mode signature generation circuit activated in said test mode signature output period for supplying said first to N-th test signals output from said first to N-th address determination circuits to said N output buffers as first to N-th test mode signatures respectively.

14. The semiconductor memory device according to claim 10, wherein said memory array, said read circuit, said first signal generation circuit and said output buffer are provided in N sets (N: integer of at least 2), and said second signal generation circuit includes:

first to M-th (M:integer greater than N) address determination circuits activated in said test mode set period for activating first to M-th test signals for setting first to M-th test modes responsively when said plurality of predetermined external address signals are set to combination of predetermined first to M-th logical levels respectively, and a test mode signature generation circuit activated in said test mode signature output period for generating N-bit test mode signatures indicating the number of activated test signal among said first to M-th test signals and supplying said N-bit test mode signatures to said N output buffers respectively.

\* \* \* \* \*